US012066733B2

(12) United States Patent
Hong et al.

(10) Patent No.: US 12,066,733 B2
(45) Date of Patent: Aug. 20, 2024

(54) DISPLAY DEVICE

(71) Applicant: Samsung Display Co., Ltd., Yongin-si (KR)

(72) Inventors: Sung Jin Hong, Seoul (KR); Sang Hoon Kim, Seoul (KR); Tae Hoon Yang, Yongin-si (KR); Seung Chan Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 946 days.

(21) Appl. No.: 16/927,697

(22) Filed: Jul. 13, 2020

(65) Prior Publication Data

US 2021/0036090 A1 Feb. 4, 2021

(30) Foreign Application Priority Data

Jul. 31, 2019 (KR) ........................ 10-2019-0093556

(51) Int. Cl.
*G02F 1/155* (2006.01)
*G02F 1/1343* (2006.01)
*H10K 59/131* (2023.01)

(52) U.S. Cl.
CPC ........ *G02F 1/155* (2013.01); *G02F 1/134336* (2013.01); *G02F 2201/123* (2013.01); *H10K 59/131* (2023.02)

(58) Field of Classification Search
CPC ..................... G02F 1/155; G02F 1/134336
See application file for complete search history.

(56) References Cited

U.S. PATENT DOCUMENTS

| | | | |
|---|---|---|---|
| 7,136,138 B1 | 11/2006 | Sekiguchi et al. | |
| 7,830,591 B2 | 11/2010 | Shimodaira | |
| 2017/0162111 A1* | 6/2017 | Kang | H10K 50/844 |
| 2017/0256747 A1 | 9/2017 | Lee et al. | |
| 2018/0069069 A1 | 3/2018 | Ebisuno et al. | |
| 2019/0130822 A1* | 5/2019 | Jung | H10K 59/00 |
| 2020/0381495 A1 | 12/2020 | Jeon et al. | |
| 2020/0410921 A1 | 12/2020 | Kim et al. | |
| 2020/0411606 A1 | 12/2020 | Kim et al. | |

FOREIGN PATENT DOCUMENTS

| | | |
|---|---|---|
| KR | 10-2017-0104097 A | 9/2017 |
| KR | 10-2017-0113066 A | 10/2017 |
| KR | 10-2018-0026602 A | 3/2018 |
| KR | 10-2020-0136549 A | 12/2020 |
| KR | 10-2021-0002171 A | 1/2021 |
| KR | 10-2021-0002232 A | 1/2021 |

* cited by examiner

*Primary Examiner* — Dung T Nguyen
(74) *Attorney, Agent, or Firm* — Lewis Roca Rothgerber Christie LLP

(57) ABSTRACT

A display device includes a substrate including a display area including a plurality of main pixels, and a sensor area including a plurality of auxiliary pixels and a plurality of transmission portions; and a plurality of wirings arranged along edges of the plurality of transmission portions and electrically connecting the plurality of auxiliary pixels to each other. The plurality of wrings includes a first directional wirings extending in a first direction and arranged in a second direction crossing the first direction, and a second directional wirings extending in the second direction and arranged in the first direction, and a wiring adjacent to the transmission portion from among the first directional wirings includes a first extension portion.

22 Claims, 23 Drawing Sheets

FIG. 2
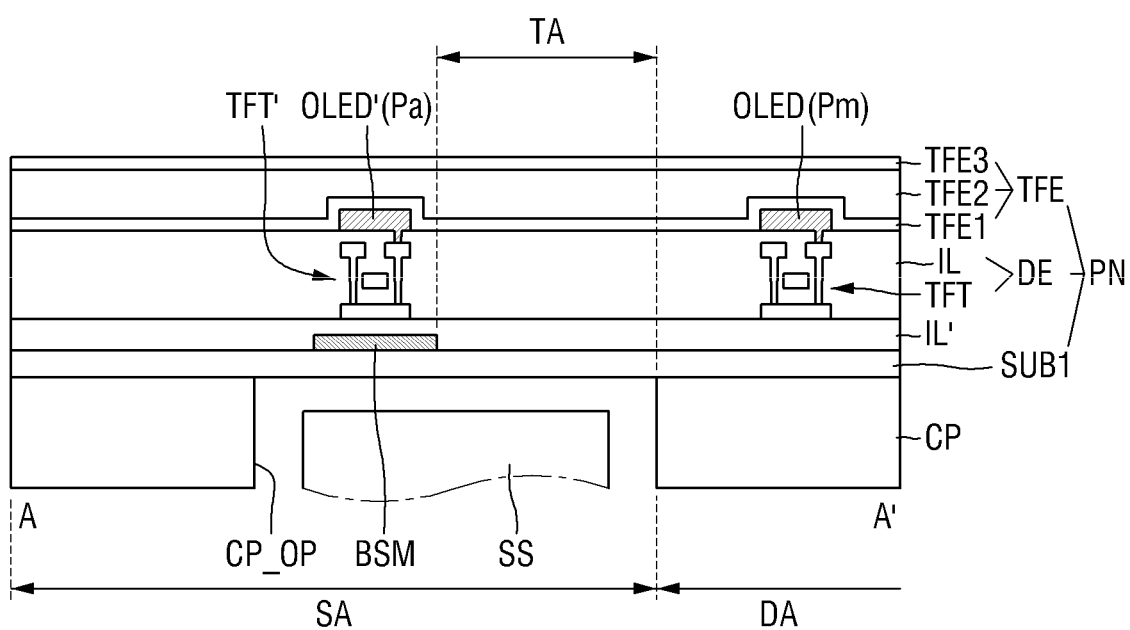
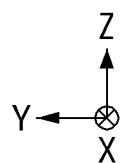

DISPLAY DEVICE

CROSS REFERENCE TO RELATED APPLICATION

This application claims priority to and the benefit of Korean Patent Application No. 10-2019-0093556, filed on Jul. 31, 2019, in the Korean Intellectual Property Office, the content of which is hereby incorporated by reference in its entirety.

BACKGROUND

1. Field

Exemplary implementations of the present disclosure relate generally to a display device.

2. Description of the Related Art

With the development of information society, requirements for display devices (for displaying images) have increased in various forms. For example, display devices are applied to various suitable electronic appliances such as smartphones, digital cameras, notebook computers, navigators, and/or smart televisions. The display device may be a flat panel display such as a liquid crystal display device, a field emission display device, an organic light emitting display device, and/or quantum dot emitting display device.

Recently, various methods for reducing or minimizing the ratio of a non-display area to a display area of a display device have been studied. One of the various methods is a method of arranging various sensors under a display panel rather than in a hole formed in the display panel. The display device in which sensors are arranged under the display panel may include sensor areas provided within a pixel region (for realizing an image) and a transmission portion (for arranging sensors).

SUMMARY

An aspect of the present disclosure is directed toward a display device, in which wirings disposed around a transmission portion is formed to have an octagonal shape or a circular shape, thereby improving the light receiving quantity and quality of a sensor device disposed under the transmission portion.

Additional features of the present disclosure will be set forth in the description which follows, and in part will be apparent from the description, or may be learned by practice of the inventive concepts.

According to an embodiment of the present disclosure, a display device includes: a substrate including a display area including a plurality of main pixels, and a sensor area including a plurality of auxiliary pixels and a plurality of transmission portions; and a plurality of wirings arranged along edges of the plurality of transmission portions and electrically connecting the plurality of auxiliary pixels to each other. The plurality of wrings includes a plurality of first directional wirings extending in a first direction and arranged in a second direction crossing the first direction, and a plurality of second directional wirings extending in the second direction and arranged in the first direction, and a wiring adjacent to the transmission portion from among the plurality of first directional wirings includes a first extension portion.

Each transmission portion of the plurality of transmission portions may have a polygonal shape, a circular shape, or an elliptical shape in a plan view.

Each transmission portion of the plurality of transmission portions may have an octagonal shape in a plan view.

The display device may further comprise a sensor device overlapping with the plurality of transmission portions in a thickness direction of the substrate, the sensor device is to utilize infrared light, visible light, and/or sound.

The plurality of first directional wirings may include: a first wiring to apply an initialization voltage into auxiliary pixels arranged in the first direction from among the plurality of auxiliary pixels; a second wiring to apply a first scan signal into the auxiliary pixels arranged in the first direction; a third wiring to apply a second scan signal into the auxiliary pixels arranged in the first direction; and a fourth wiring to apply an emission control signal into the auxiliary pixels arranged in the first direction.

The plurality of second directional wirings may include: a fifth wiring to apply a data voltage into auxiliary pixels arranged in the second direction from among the plurality of auxiliary pixels; and a sixth wiring to apply a first power into the auxiliary pixels arranged in the second direction.

In an area in which the auxiliary pixels arranged in the first direction are arranged, the second wiring, the third wiring, and the fourth wiring may be on the substrate, a first insulation layer may be on the second wiring, the third wiring, and the fourth wiring, and the first wiring may be on the first insulation layer.

In the edges of the plurality of transmission portions, the second wiring and the fourth wiring may be on the substrate, and the first wiring and a connection wiring of the third wiring may be on the first insulation layer.

The connection wiring of the third wiring may be connected to the third wiring through a first contact hole which penetrates the first insulating layer.

In the area in which the auxiliary pixels arranged in the first direction are arranged, a second insulation layer may be on the first wiring, and the fifth wiring and the sixth wiring may be on a second insulation layer.

In the edges of the plurality of transmission portions, the fifth wiring may be on the second insulation layer, a third insulation layer may be on the fifth wiring, and a connection wiring of the sixth wiring may be on the third insulation layer.

The connection wiring of the sixth wiring may be connected to the sixth wiring through a second contact hole which penetrates the third insulating layer.

Each of the first to sixth wirings may include a bending portion which is bent at the edges of the plurality of transmission portions in a plan view, and the first extension portion may be extended from the bending portion of the fourth wiring.

The first extension portion may have a triangle shape in a plan view.

The first extension portion may include a first hypotenuse facing the bending portion, and an angle of the first hypotenuse to the first direction may be different for each transmission portion.

The sixth wiring may include a second extension portion extending from the bending portion of the sixth wiring toward the transmission portion.

The second extension portion may have a triangle shape in a plan view.

The first extension portion may include a same material (e.g., be the same in material) as the fourth wiring, and the second extension portion may include a same material (e.g., be the same in material) as the sixth wiring.

The second extension portion may include a second hypotenuse facing the bending portion, and an angle of the second hypotenuse to the first direction may be different from the angle of the first hypotenuse to the first direction.

According to another embodiment of the present disclosure, a display device includes: a substrate including a display area including a plurality of main pixels, and a sensor area including a plurality of auxiliary pixels and a plurality of transmission portions; and a plurality of wirings arranged along edges of the plurality of transmission portions and electrically connecting the plurality of auxiliary pixels to each other. The plurality of wrings includes a plurality of first directional wirings extending in a first direction and arranged in a second direction crossing the first direction, and a plurality of second directional wirings extending in the second direction and arranged in the first direction, and each of the plurality of first directional wirings and the plurality of second directional wirings includes at least two bending portions at the edges of the transmission portions.

An area of one of the plurality of transmission portions may be larger than a light emitting area of one of the plurality of auxiliary pixels.

The plurality of first directional wirings and the plurality of second directional wirings may overlap each other in a thickness direction of the substrate in the at least two bending portions.

It is to be understood that both the foregoing general description and the following detailed description are exemplary and explanatory, and are intended to provide further explanation of the subject matter of the present disclosure as claimed, and equivalents thereof.

BRIEF DESCRIPTION OF THE DRAWINGS

The accompanying drawings, which are included to provide a further understanding of the present disclosure and are incorporated in and constitute a part of this specification, illustrate exemplary embodiments of the present disclosure, and together with the description serve to explain the subject matter of the present disclosure.

FIG. 2 is a schematic cross-sectional view of a display device according to an embodiment.

DETAILED DESCRIPTION

Figure 1:
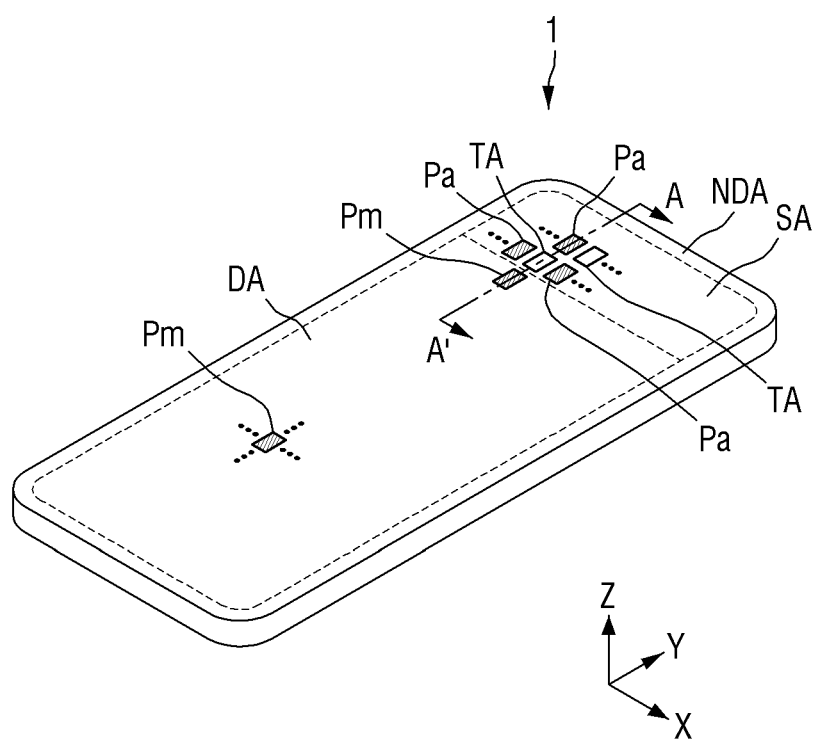
FIG. 1 is a schematic perspective view of a display device according to an embodiment.

In the following description, for the purposes of explanation, numerous specific details are set forth in order to provide a thorough understanding of various exemplary embodiments of the present disclosure. As used herein "embodiments" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, known (e.g., well-known) structures and devices are shown in block diagram form in order to avoid unnecessarily obscuring various exemplary embodiments. Further, various exemplary embodiments may be different, but do not have to be exclusive. For example, specific shapes, configurations, and/or characteristics of an exemplary embodiment may be utilized or implemented in another exemplary embodiment without departing from the subject matter of the present disclosure.

Unless otherwise specified, the illustrated exemplary embodiments are to be understood as providing exemplary features of varying detail of some ways in which the subject matter of the present disclosure may be implemented in practice. Therefore, unless otherwise specified, the features, sensor devices, modules, layers, films, panels, regions, and/or aspects, etc. (hereinafter individually or collectively referred to as "elements"), of the various embodiments may be otherwise combined, separated, interchanged, and/or rearranged without departing from the subject matter of the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless otherwise specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc., may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, sensor devices, and/or groups thereof, but do not preclude the presence or addition of one or more other features, integers, steps, operations, elements, sensor devices, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic perspective view of a display device according to an embodiment. Referring to FIG. 1, a display device 1 includes a display area DA for implementing (e.g., displaying) an image and a non-display area NDA for not implementing an image. The display device 1 may provide a main image by utilizing light emitted from a plurality of main pixels Pm arranged in the display area DA.

The display device 1 includes a sensor area SA. As will be described in more detail later with reference to FIG. 2, the sensor area SA may be an area in which a sensor device (such as a sensor) utilizing infrared light, visible light, and/or sound is disposed. The sensor area SA may include a transmission portion (e.g., a transmission area) TA through which light and/or sound output from the sensor device to the outside or traveling toward the sensor device from the outside may be transmitted.

A plurality of auxiliary pixels Pa may be arranged, and a set or predetermined image may be provided by utilizing light emitted from the plurality of auxiliary pixels Pa. The image provided from the sensor area SA may be an auxiliary image, and may have a lower resolution than the image provided from the display area DA. That is, because the sensor area SA includes a transmission portion TA through which light and/or sound is transmitted, the number of auxiliary pixels Pa per unit area may be smaller than the number of main pixels Pm per unit area.

The sensor area SA may be disposed at one side of the display area DA. In an embodiment, it is shown in FIG. 1 that the sensor area SA is disposed at the upper side of the display area DA, and is disposed between the non-display area NDA and the display area DA.

Hereinafter, although an organic light emitting display device is described as an example of the display device 1 according to an embodiment of the present disclosure, the display device of the present disclosure is not limited thereto. In another embodiment, various suitable kinds (types) of display devices such as an inorganic light emitting display device and/or a quantum dot light emitting display device may be utilized as the display device 1.

Although it is shown in FIG. 1 that the sensor area SA is disposed at the upper side of the display area DA having a rectangular shape, the present disclosure is not limited thereto. The shape of the display area DA may be a circle, an ellipse, or a polygon such as a triangle or a pentagon. The position and number of the sensor areas SA may also be changed in various suitable ways.

FIG. 2 is a schematic cross-sectional view of a display device according to embodiments, and may correspond to a cross-section taken along the line A-A' of FIG. 1.

Referring to FIG. 2, the display device 1 may include a display panel PN including a display element, and a sensor device corresponding to the sensor area SA.

The display panel PN may include a substrate SUB1, a display element layer DE disposed on the substrate SUB1, and a thin film encapsulation layer TFE that is an encapsulation member for encapsulating the display element layer DE. The display panel PN may further include a cover pad CP disposed under the substrate SUB1.

The substrate SUB1 may include glass or a polymer resin. Examples of the polymer resin may include polyethersulfone (PES), polyacrylate (PAR), polyetherimide (PEI), polyethyelene napthalate (PEN), polyethyelene terepthalate (PET), polyphenylene sulfide (PPS), polyallylate, polyimide (PI), polycarbonate (PC), and cellulose acetate propionate (CAP). The substrate SUB1 including the polymer resin may have flexible, rollable, and/or bendable characteristics. In one embodiment, the substrate SUB1 may have a multilayer structure including a layer including the aforementioned polymer resin and an inorganic layer.

The display element layer DE may include a circuit layer including a thin film transistor TFT or TFT', an organic light emitting diode OLED or OLED' as a display element, and an insulating layer IL or IL' disposed therebetween.

The display area DA may be provided with a main pixel Pm including a main thin film transistor TFT and an organic light emitting diode OLED connected to the main thin film transistor TFT, and the sensor area SA may be provided with an auxiliary pixel Pa including an auxiliary thin film transistor TFT' and an organic light emitting diode OLED' connected to the auxiliary thin film transistor TFT'.

The sensor area SA may be provided with a transmission portion in which the auxiliary thin film transistor TFT' and the display element are not disposed. The transmission portion TA may be understood as a region through which light/signal emitted from a sensor device SS or light/signal incident to the sensor device SS is transmitted.

The sensor device SS may be located in the sensor area SA. The sensor device SS may be an electronic element utilizing light or sound. For example, the sensor device SS may be a sensor for receiving and utilizing light (such as an infrared sensor), a sensor for measuring a distance or recognizing a fingerprint by outputting and detecting light or sound, a small lamp for outputting light, a speaker for outputting sound, and/or a camera for taking an image. The electronic element utilizing light may also use light of various suitable wavelength bands, such as visible light, infrared light, and/or ultraviolet light. The number of sensor devices SS arranged in the sensor area SA may be provided in plural. For example, as the sensor devices SS, a light emitting element and a light receiving device may be provided together in one sensor area SA. In one alternative embodiment, a light emitting unit and a light receiving unit may be concurrently or simultaneously provided in one sensor device SS. Although it is shown in the drawings that one sensor device SS is disposed to corresponds to one auxiliary pixel Pa and the transmission portion TA for convenience of explanation, one sensor device SS may be disposed to correspond to a plurality of auxiliary pixels Pa and the transmission portion TA.

A lower metal layer BSM may be disposed in the sensor area SA. The lower metal layer BSM may be disposed under the auxiliary thin film transistor TFT' to correspond to the auxiliary thin film transistor TFT'. The lower metal layer BSM may prevent or substantially prevent external light from reaching the auxiliary pixel Pa including the auxiliary thin film transistor TFT'. For example, the lower metal layer BSM may prevent or substantially prevent light emitted from the sensor device SS from reaching the auxiliary pixel Pa.

In some embodiments, a constant voltage or a signal is applied to the lower metal layer BSM to reduce or prevent damage to the pixel circuit due to electrostatic discharge.

The thin film encapsulation layer TFE may include at least one inorganic encapsulation layer and at least one organic encapsulation layer. In this regard, FIG. 2 shows first and second inorganic encapsulation layers TFE1 and TFE3 and an organic encapsulation layer TFE2 between the first and second inorganic encapsulation layers TFE1 and TFE3.

The first and second inorganic encapsulation layers TFE1 and TFE3 may include at least one inorganic insulating material selected from aluminum oxide, titanium oxide, tantalum oxide, hafnium oxide, zinc oxide, silicon oxide, silicon nitride, and silicon oxynitride. The organic encapsulation layer TFE2 may include a polymer-based material. Examples of the polymer-based material may include acrylic resin, epoxy resin, polyimide, and polyethylene.

The cover pad CP may be attached to the lower surface of the substrate SUB1. The cover pad CP may have an opening CP_OP corresponding to the sensor area SA. The opening CP_OP is provided in the cover pad CP, thereby improving the light transmittance of the sensor area SA.

In one or more embodiments, the cover pad CP may include a protective layer and/or a cushion layer.

The protective layer may protect the substrate SUB1 from external impact occurring at (e.g., applied through) the bottom of the substrate SUB1. For example, the protective layer may protect the substrate SUB1 from contamination, scratch, and/or impact that may occur in the process of manufacturing and/or utilizing the display device. The protective layer may contain ingredients such as fine powder silica, a silicone-based antifoaming agent, an additive, an antistatic agent, a petroleum naphtha solvent, and/or diethylene glycol monoethyl ether acetate.

The cushion layer may be disposed on the lower surface of the protective layer. The cushion layer has an adhesive layer on one surface thereof, and may thus be attached to the lower surface of the protective layer through the adhesive layer.

The cushion layer may include a buffer member that can absorb external shocks. The buffer member may include a material capable of absorbing shocks. In an embodiment, the buffer member may be formed of a sponge in which an elastic polymer resin, a rubber liquid, a urethane material, and/or an acrylic material is foamed.

The cushion layer may further include a light blocking member for preventing or substantially preventing light emitted from the substrate SUB1 from leaking to the bottom of the substrate SUB1 and/or a heat radiation member for radiating the heat generated by the display device 1 in addition to the aforementioned buffer member. The heat radiation member may include a metal having suitable (e.g., excellent) thermal conductivity (such as copper (Cu), silver (Ag), a copper alloy, and/or aluminum (Al)), or may include a carbon-based material (such as graphite and/or graphene). The aforementioned buffer member, light blocking member, and heat radiation member may be stacked in a thickness direction.

In one or more embodiments, a lower protective film for supporting and protecting the substrate SUB1 may be further provided between the substrate SUB1 and the panel bottom cover CP.

The lower protective film may be disposed to overlap the entire sensor area SA, and may include polyethylene terephthalate (PET) and/or polyimide (PI).

The area of the sensor area SA may be larger than the area in which the sensor device SS is disposed. Accordingly, the area of the opening CP_OP provided in the cover pad CP may not match the area of the sensor area SA. For example, the area of the opening CP_OP may be smaller than the area of the sensor area SA.

A plurality of sensor devices SS may be disposed in the sensor area SA. The plurality of sensor devices SS may have different functions from each other.

In one or more embodiments, the display panel PN may further be provided thereon with an input detecting member for detecting a touch input, an anti-reflective member including a polarizer and a retarder or a color filter and a black matrix, and/or a transparent window.

Meanwhile, although it is described in the present embodiment that the thin film encapsulation layer TFE is utilized as an encapsulation member for encapsulating the display element layer DE, the present disclosure is not limited thereto. For example, an encapsulation substrate attached to the substrate SUB1 by sealant and/or frit may be utilized as the encapsulation member for encapsulating the display element layer DE.

Figure 3:
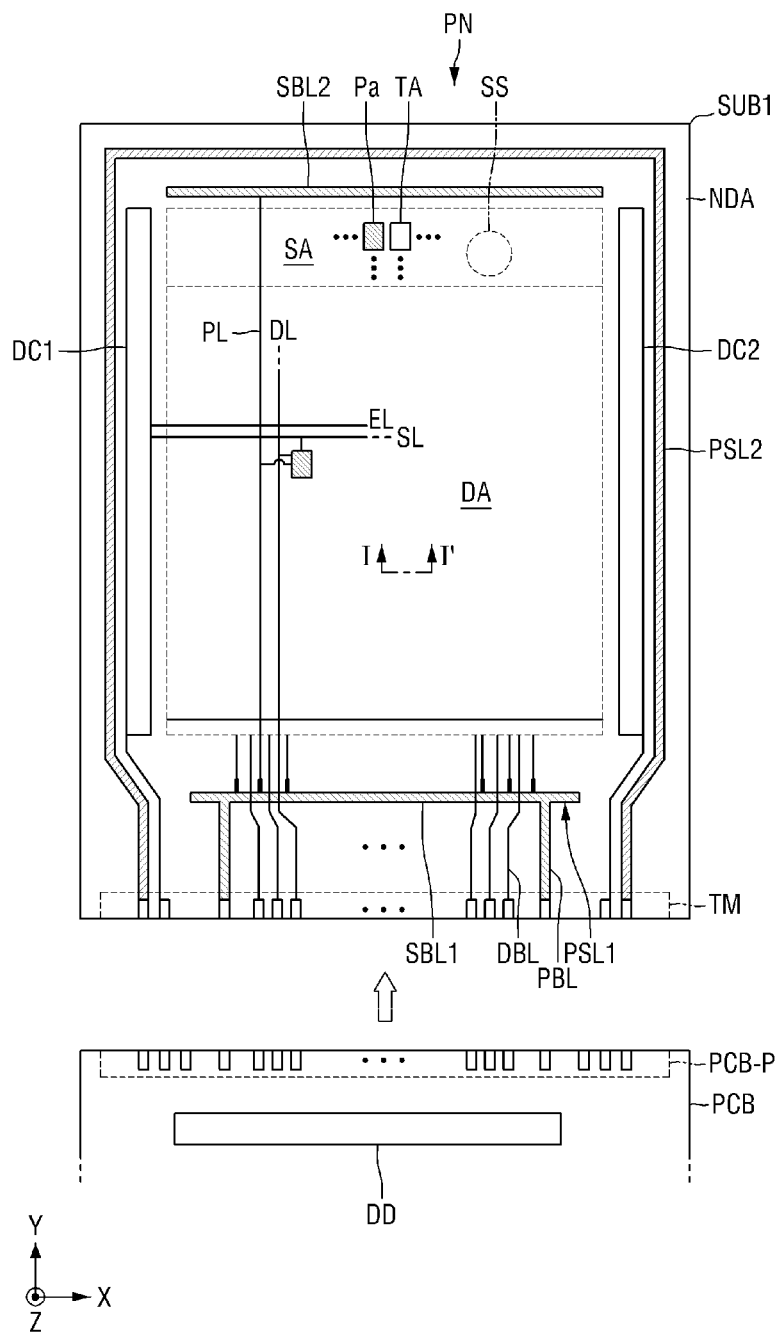
FIG. 3 is a schematic plan view of a display device according to an embodiment.

FIG. 3 is a schematic plan view of a display device according to an embodiment.

Referring to FIG. 3, the display panel PN is disposed in the display area DA and includes a plurality of main pixels Pm. Each of the main pixels Pm may include a display element such as an organic light emitting diode. Each main pixel Pm may emit, for example, red, green, blue or white light through the organic light emitting diode. As utilized herein, as described above, the main pixel Pm may be understood as a sub-pixel that emits light of any one of red, green, blue, and white colors. The display area DA may be covered by the encapsulation member described above with reference to FIG. 2 to protect the display area DA from external air and/or moisture.

The sensor area SA may be disposed at one side of the display area DA, and a plurality of auxiliary pixels Pa may be arranged in the sensor area SA. Each of the auxiliary pixels Pa may include a display element such as an organic light emitting diode. Each auxiliary pixel Pa may emit, for example, red, green, blue, or white light through the organic light emitting diode. As used herein, as described above, the auxiliary pixel Pa may be understood as a sub-pixel that emits light of any one of red, green, blue, and white colors. Meanwhile, the sensor area SA may be provided with a transmission portion TA disposed between the auxiliary pixels Pa. At least one sensor device SS may be disposed to correspond to the lower portion of the sensor area SA of the display panel PN.

In an embodiment, one main pixel Pm and one auxiliary pixel Pa may include the same pixel circuit. However, the present disclosure is not limited thereto. The pixel circuit included in the main pixel Pm and the pixel circuit included in the auxiliary pixel Pa may be different from each other.

Because the sensor area SA includes the transmission portion TA, the resolution of the sensor area SA may be lower than that of the display area DA. For example, the resolution of the sensor area SA may be about ½ of that of the display area DA.

Each of the pixels Pm and Pa may be electrically connected to external circuits arranged in the non-display area. A first scan driving circuit DC1, a second scan driving circuit DC2, a terminal TM, a data driving circuit DD, a first power supply line PSL1, and a second power supply line PSL2 are arranged in the non-display area NDA.

The first scan driving circuit DC1 may provide a scan signal to each of the pixels Pm and Pa through a scan line SL. The first scan driving circuit DC1 may provide a light emission control signal to each pixel through a light emission control line EL. The second scan driving circuit DC2 may be disposed in parallel with the first scan driving circuit DC1 with the display area DA interposed therebetween. Some of the pixels Pm and Pa disposed in the display area DA may be electrically connected to the first scan driving circuit DC1, and the others of the pixels Pm and Pa may be connected to the second scan driving circuit DC2. In another embodiment, the second scan driving circuit DC2 may be omitted.

The terminal TM may be disposed at one side of the substrate SUB1. The terminal TM may be exposed without being covered by the insulating layer and electrically connected to a printed circuit board PCB. The terminal PCB-P of the printed circuit board PCB may be electrically connected to the terminal TM of the display panel PN. The printed circuit board PCB transmits a signal or power of a controller to the display panel PN. The control signal generated by the controller may be transmitted to the first and second scan driving circuits DC1 and DC2 through the printed circuit board PCB. The controller may provide first and second power VDDL and VSSL (refer to FIG. 7 to be described later) to the first and second power supply lines PSL1 and PSL2, respectively, through the first and second connection lines PBL1 and PBL2. The first power supply voltage VDD is provided to each of the pixels Pm and Pa through the driving voltage line PL connected to the first power supply line PSL1, and the second power supply voltage ELVSS may be provided to a counter electrode of each of the pixels Pm and Pa connected to the second power supply line PSL2.

The data driving circuit DD is electrically connected to the data line DL. The data signal of the data driving circuit DD may be provided to each of the pixels Pm and Pa through the connection line DBL connected to the terminal TM and the data line DL connected to the connection line DBL. Although it is shown in FIG. 3 that the data driving circuit DD is disposed on the printed circuit board PCB, in another embodiment, the data driving circuit DD may be disposed on the substrate SUB1. For example, the data driving circuit DD may be disposed between the terminal TM and the first power supply line PSL1.

The first power supply line PSL1 may include a first sub-line SBL1 and a second sub-line SBL2 extending in parallel to each other along the X direction with the display area DA interposed therebetween. The second power supply line PSL2 may partially surround the display area DA in a loop shape with one side open.

Figure 4:
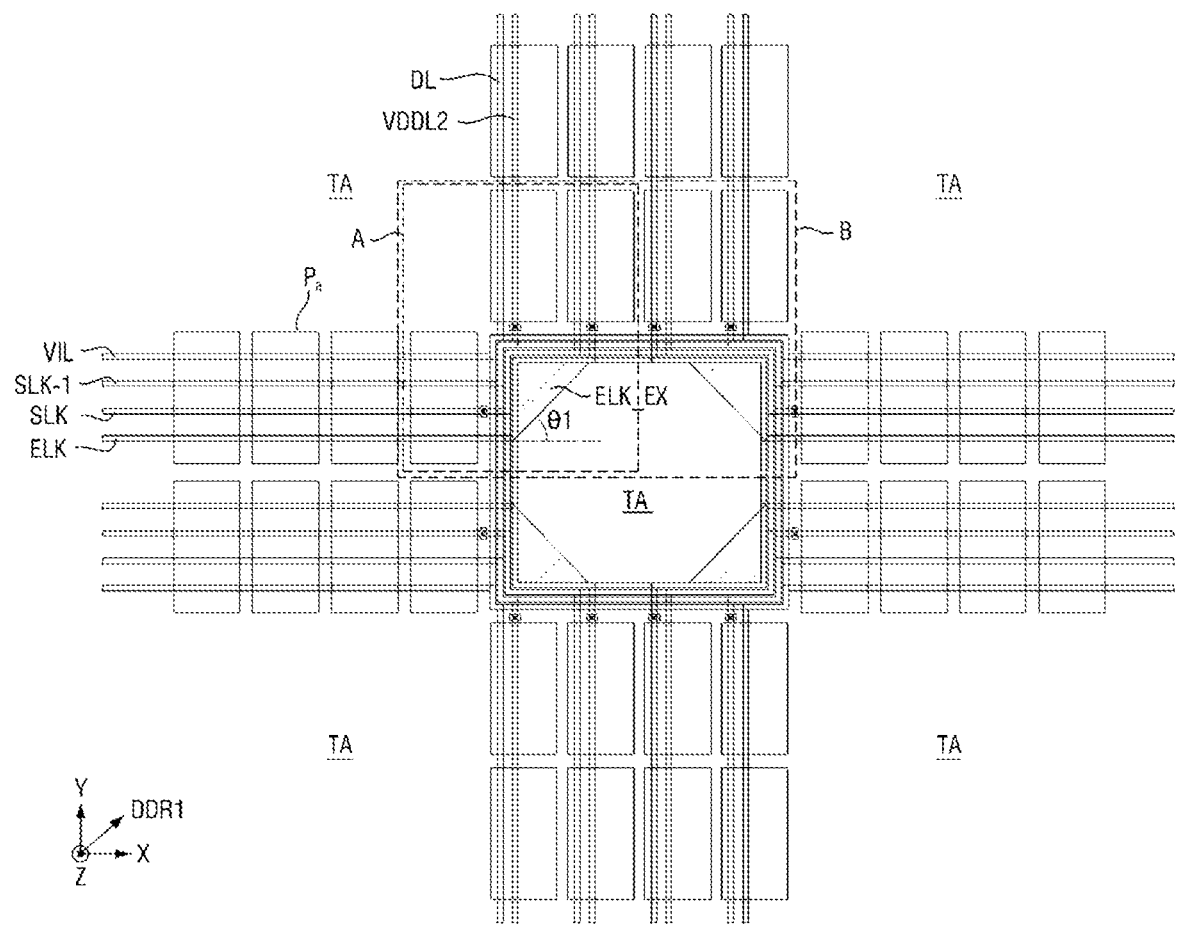
FIG. 4 is a view showing wirings disposed on a transmission portion according to an embodiment.

FIG. 4 is a view showing wrings disposed on a transmission portion according to an embodiment.

Referring to FIG. 4, the sensor area SA may include a plurality of auxiliary pixels Pa, transmission portions TA, and a plurality of lines VIL, SLK-1, SLK, ELK, DL, and VDDL2 connecting the plurality of auxiliary pixels Pa.

At least one pixel Pa may be included in a pixel group Pg. It is shown in FIG. 4 that one pixel group Pg includes eight auxiliary pixels Pa arranged in two rows and four columns. However, the present disclosure is not limited thereto. The number and arrangement of the pixels Pa and Pm included in one pixel group Pg may be variously suitably changed. For example, one pixel group Pg may include three auxiliary pixels Pa arranged in one row and three columns, or may include four auxiliary pixels Pa arranged in two rows and two columns. As used herein, the auxiliary pixels Pa may refer to sub-pixels that emit light of red, green, blue, and white colors.

The transmission portion TA is a region having high light transmittance because no display element is disposed, and the sensor area SA may be provided with a plurality of transmission portions TA. The transmission portions TA may be alternately arranged with the pixel group Pg along the first direction X and/or the second direction Y. In one alternative embodiment, the transmission portions TA may be disposed to surround the pixel group Pg. In one alternative embodiment, the auxiliary pixels Pa may be disposed to surround the transmission portion TA.

The size of the transmission portion TA may be larger than that of the light emitting region of the at least one auxiliary pixel Pa. In some embodiments, the size of the transmission portion TA may be equal to or larger than the size of one pixel group Pg.

The plurality of pixel groups Pg may be electrically connected to each other through the plurality of lines VIL, SLK-1, SLK, ELK, DL, and VDDL2. For example, the pixels groups Pg arranged in a matrix form may be electrically connected to each other by four lines VIL, SLK-1, SLK, and ELK extending in the first direction X and two lines DL and VDDL2 extending in the second direction Y.

According to an embodiment, the four lines VIL, SLK-1, SLK, and ELK extending in the first direction X may include an initialization voltage line VIL, a K−1th (i.e., (k−1)th) scan line SLK-1, a Kth scan line SLK, and a light emission control line ELK. The two lines DL and VDDL2 extending in the second direction Y may include a data line DL and a driving voltage line VDDL2.

When the plurality of lines VIL, SLK-1, SLK, ELK, DL, and VDDL2 are formed on the transmission portion TA, the plurality of wirings VIL, SLK-1, SLK, ELK, DL, and VDDL2 may be arranged along the shape of the edge of the transmission portion TA for the light transmittance of the transmission portion TA. For example, the shape of the transmission portion TA surrounded by the plurality of pixel groups Pg may be a quadrangle, and the plurality of lines VIL, SLK-1, SLK, ELK, DL, and VDDL2 may be formed to be bent at right angles near four vertices of the quadrangle.

Some of the plurality of lines VIL, SLK-1, SLK, ELK, DL, and VDDL2 may be disposed to overlap each other in the third direction (Z direction). As shown in FIG. 4, based on the rectangular transmission portion TA disposed at the center, the data lines DL extending in the second direction (Y direction) on the two auxiliary pixels Pa arranged in one row of the auxiliary pixels Pa (as part of the pixel group Pg arranged in two rows and four columns) adjacent to the upper side of the transmission portion TA may be disposed to overlap the initialization voltage line VIL, the K−1th scan line SLK-1, the Kth scan line SLK, and the light emission control line ELK, which are extended in the first direction (X direction) and sequentially arranged in the second direction (Y direction), in the third direction (Z direction) in some areas.

The lines ELK disposed closest to the center of the transmission portion TA may include an extension portion ELK_EX in some areas. For example, the extension portion ELK_EX may be formed in a triangular shape in one region of the control line ELK. One region of the control line ELK may be a bending portion formed by bending at the four vertices of the rectangular transmission portion TA at right angles. That is, the rectangular transmission portion TA includes the extension portions ELK_EX at four vertices, and as a result, may have an octagonal shape.

Referring to FIG. 2, a sensor device (such as a sensor) utilizing infrared light, visible light and/or sound may be disposed under the plurality of transmission portions TA. That is, light and/or sound output from the sensor device toward the outside or traveling from the outside toward the sensor device may be transmitted through the plurality of transmission portions. According to an embodiment, when a deposition material including an opaque metal ingredient is deposited on the transmission portion TA, light transmittance may be reduced by about 30% or more. The plurality of lines VIL, SLK-1, SLK, ELK, DL, and VDDL2 and the plurality of extension portions ELK_EX disposed on the transmission portion TA may include opaque metals. Hereinafter, the reason why the extension portion ELK_EX is disposed on the transmission portion TA will be described with reference to FIGS. 5 and 6.

Figure 5A:
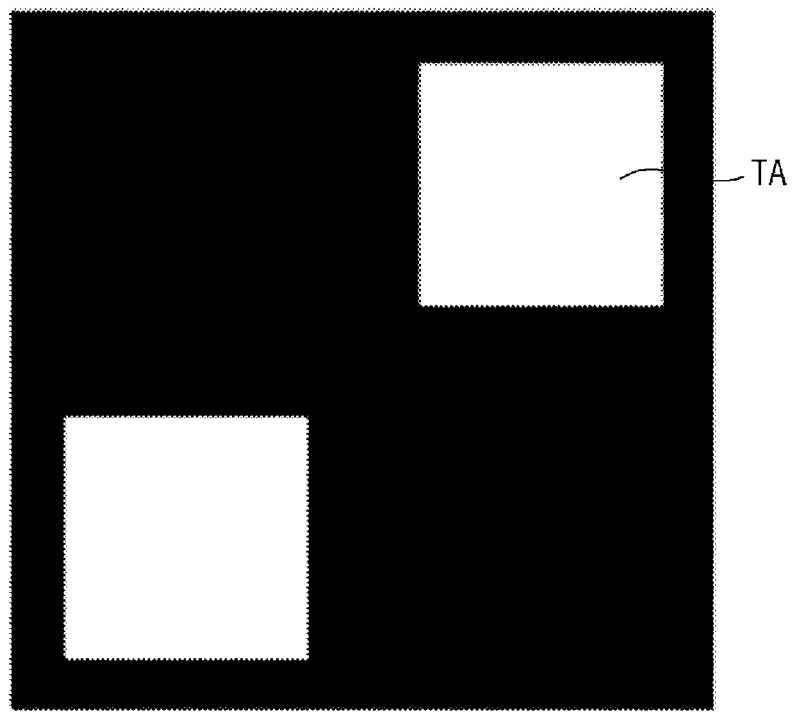
FIGS. 5A and 5B are views showing the diffraction degree of light emitted from a sensor device when a transmission portion has a rectangular shape.
Figure 5B:
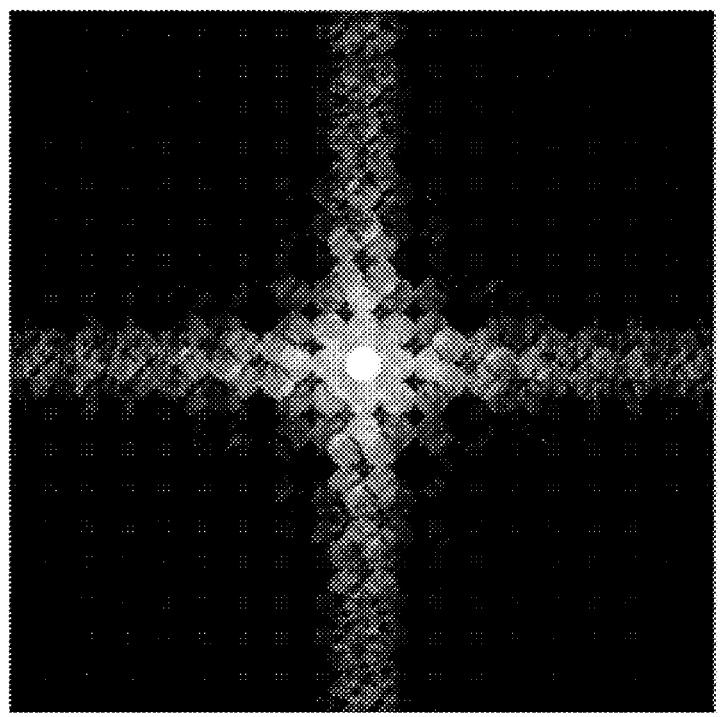
Figure 6A:
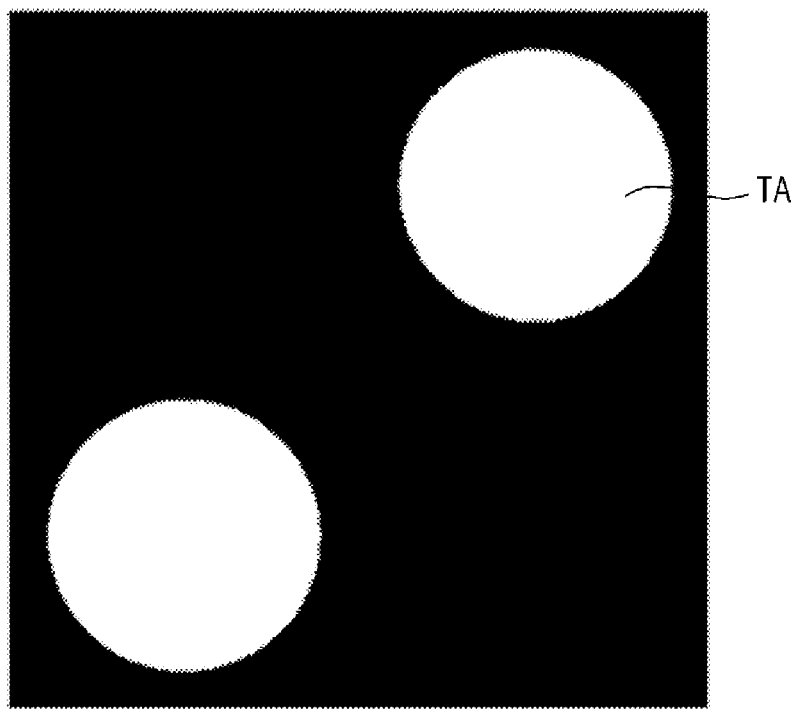
FIGS. 6A and 6B are views showing the diffraction degree of light emitted from a sensor device when a transmission portion has a circular shape.
Figure 6B:
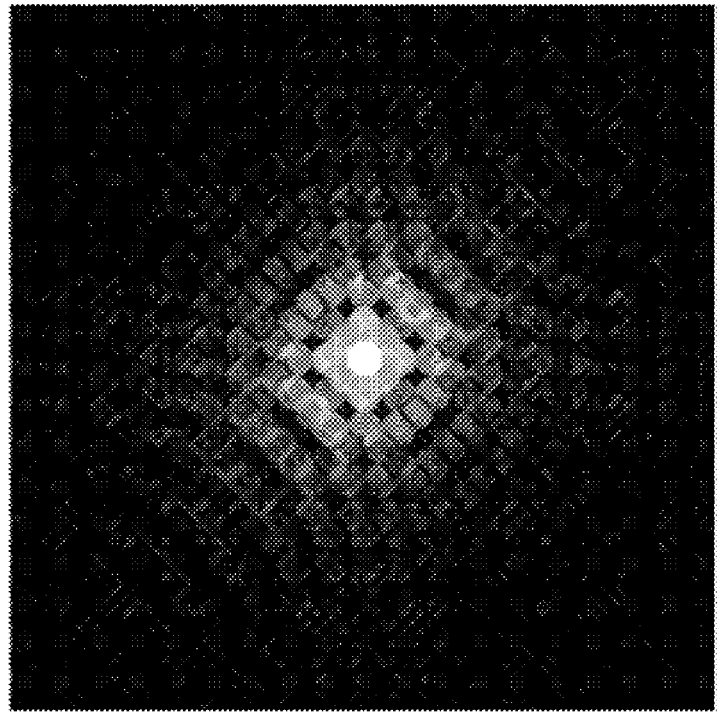

FIGS. 5A and 5B are views showing the diffraction degree of light emitted from a sensor device when a transmission portion has a rectangular shape. FIGS. 6A and 6B are views showing the diffraction degree of light emitted from a sensor device when a transmission portion has a circular shape.

Referring to FIGS. 5A, 5B, 6A, and 6B, as shown in FIGS. 5A and 6A, the region marked in black may be contrasted with (e.g., may represent) a region where the aforementioned display elements are disposed, and the rectangular and circular regions marked in white may be contrasted with (e.g., may represent) regions where the transmission portions TA are disposed.

As shown in FIGS. 5B and 6B, assuming that light is emitted from rectangular and circular openings, the light passing through the rectangular opening is diffracted in a cross shape, whereas the light passing through the circular opening does not have a large difference along up, down, left and right directions. That is, even when the ratio of the rectangular opening and the circular opening (e.g., the ratio of the area of the rectangular opening and the circular opening to the total area) is the same, the diffraction phenomenon may occur less at the circular opening rather than the rectangular opening.

The diffraction phenomenon, which is one of representative wave phenomena, is a phenomenon in which waves propagate to the back side of an obstacle or a narrow gap when a light wave and/or a sound wave pass through the obstacle or the narrow gap. When there is an obstacle having a gap in the path of particles, the particles pass through the gap and travel straight (e.g., along a straight path). In contrast, in the case of waves, the waves travel not only along a straight path passing through the gap, but also to a set or predetermined range around the straight path. Like this, the diffraction is a phenomenon in which waves bend and reach the area where particles cannot go.

Light and/or sound output from a sensor device, such as a sensor disposed under the transmission portion TA, toward the outside, or traveling from the outside toward the sensor device may be transmitted. In this case, the larger the aforementioned diffraction phenomenon, the lower the detection ability of a sensor device (such as a sensor). The reason for this is that the amount of light and/or sound traveling in the straight path may be reduced because the waves travel not only along a straight path passing through the gap, but also to a set or predetermined range around the straight path in accordance with an increase in diffraction. That is, the emission amount and incident amount of light and/or sound utilized by a sensor device (such as a sensor) may be reduced. Accordingly, in order to maintain a good detection force of a sensor device (such as a sensor) disposed under the transmission portion TA, it is desirable to reduce or minimize the diffraction phenomenon of the transmission portion TA.

Hereinafter, an arrangement relationship of the plurality of lines arranged on the plurality of auxiliary pixels Pa and a plurality of transmission portions TA will be described in more detail with reference to FIGS. 7 to 12.

Figure 7:
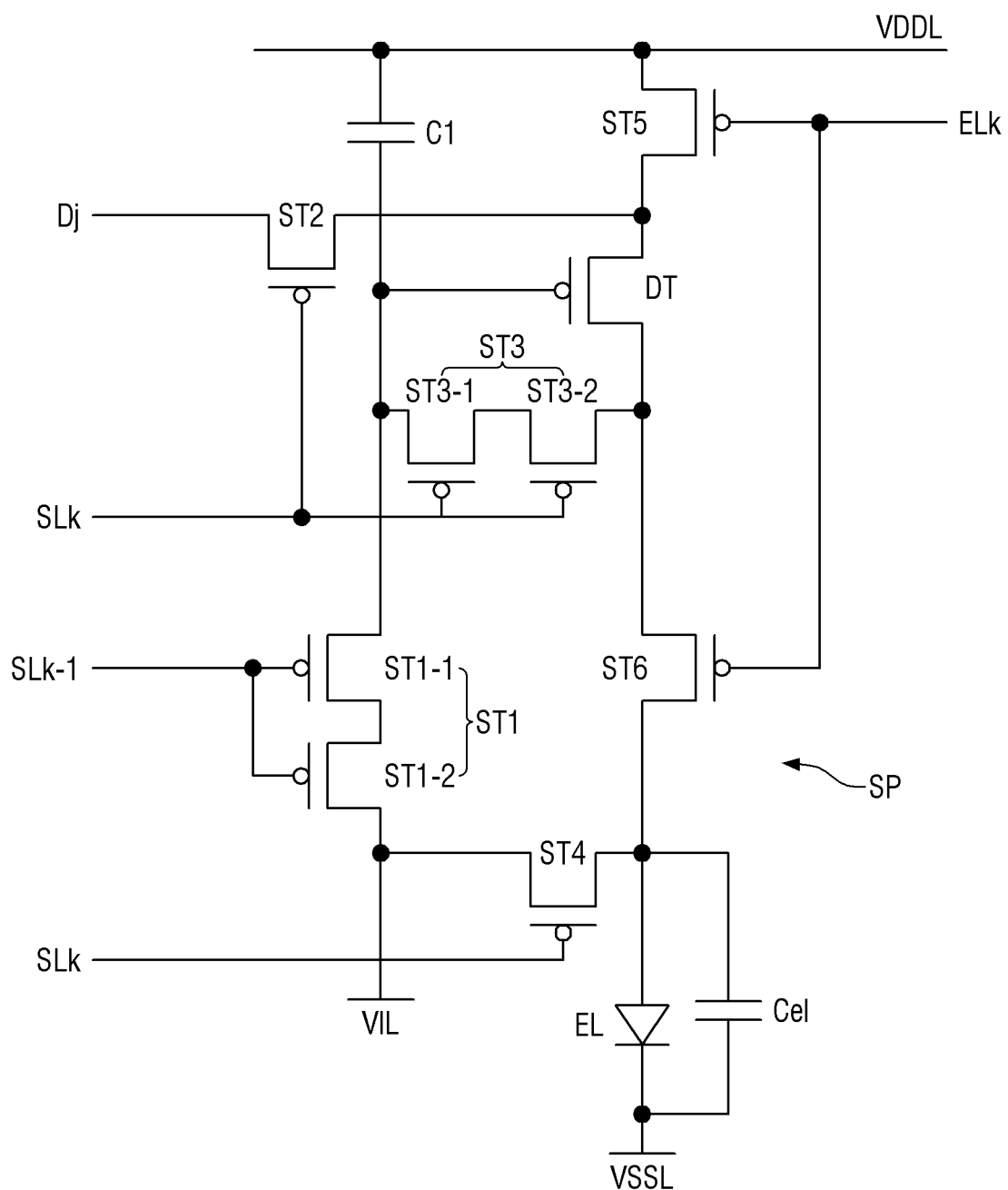
FIG. 7 is an equivalent circuit diagram of a pixel for performing active matrix driving that may be disposed in a display area of a display device according to an embodiment.

FIG. 7 is a circuit diagram specifically illustrating a sub-pixel according to an embodiment.

Referring to FIG. 7, a pixel circuit PC may be connected to a k−1th (k is a positive integer of 2 or more) scan line SLK-1, a kth scan line SLK, and a jth (j is a positive integer) data line Dj. Further, the pixel circuit PC may be connected to a first driving voltage line VDDL to which a first driving voltage is supplied, an initialization voltage line VIL to which an initialization voltage Vini is supplied, and a second driving voltage line VSSL to which a second driving voltage is supplied.

The pixel circuit PC includes a driving transistor DT, a light emitting element EL, switching elements, and a first capacitor C1. The switching elements include first to sixth transistors ST1, ST2, ST3, ST4, ST5, and ST6.

The driving transistor DT may include a gate electrode, a first electrode, and a second electrode. The gate electrode may be an upper gate electrode disposed on the active layer of the driving transistor DT.

The gate electrode of the driving transistor DT may be connected to the first electrode of the capacitor C, the first electrode of the driving transistor DT may be connected to the first driving voltage line VDDL through the fifth transistor ST5, and the second electrode of the driving transistor DT may be electrically connected to the pixel electrode of the main organic light emitting element EL through the sixth transistor ST6. The driving transistor DT receives a data signal according to the switching operation of the second transistor ST2 and supplies a driving current Ids to the main organic light emitting element EL.

The light emitting element EL emits light according to the driving current Ids. The amount of light emitted by the light emitting element EL may be proportional to the driving current Ids.

The light emitting element EL may be an organic light emitting diode including an anode electrode, a cathode electrode, and an organic light emitting layer disposed between the anode electrode and the cathode electrode. In one alternative embodiment, the light emitting element EL may be an inorganic light emitting element including an anode electrode, a cathode electrode, and an inorganic semiconductor layer disposed between the anode electrode and the cathode electrode. In one alternative embodiment, the light emitting element EL may be a quantum dot light emitting element including an anode electrode, a cathode electrode, and a quantum dot light emitting layer disposed between the anode electrode and the cathode electrode. In one alternative embodiment, the light emitting element EL may be a micro light emitting diode.

The anode electrode of the light emitting device EL may be connected to the first electrode of the fourth transistor ST4 and the second electrode of the sixth transistor ST6, and the cathode electrode of the light emitting element EL may be connected to the second driving voltage line VSSL.

The first transistor ST1 may be formed as a dual transistor including a first-first transistor ST1-1 and a first-second transistor ST1-2. The gate electrode of the first-first transistor ST1-1 may be connected to the k−1th scan line SLk-1, the first electrode thereof may be connected to the gate electrode of the driving transistor DT, and the second electrode thereof may be connected to the first electrode of the first-second transistor ST1-2. The gate electrode of the first-second transistor ST1-2 may be connected to the k−1th scan line SLk-1, the first electrode thereof may be connected to the second electrode of the first-first transistor ST1-1, and the second electrode thereof may be connected to the initialization voltage line VIL.

The second transistor ST2 is turned on by the scan signal of the kth scan line SLk to connect the first electrode of the driving transistor DT to the jth data line Dj. The gate electrode of the second transistor ST2 may be connected to the kth scan line SLk, the first electrode thereof may be connected to the first electrode of the driving transistor DT, and the second electrode thereof may be connected to the data line Dj.

The third transistor ST3 may be formed as a dual transistor including a third-first transistor ST3-1 and a third-second transistor ST3-2. The third-first transistor ST3-1 and the third-second transistor ST3-2 are turned on by the scan signal of the kth scan line SLk to connect the gate electrode and second electrode of the driving transistor DT. That is, when third-first transistor ST3-1 and the third-second transistor ST3-2 are turned on, the gate electrode and the second electrode of the driving transistor DT are connected to each other, so that the driving transistor DT is driven by a diode. The gate electrode of the third-first transistor ST3-1 may be connected to the kth scan line SLk, the first electrode thereof may be connected to the second electrode of the third-second transistor ST3-2, and the second electrode thereof may be connected to the gate electrode of the driving transistor DT. The gate electrode of the second transistor ST2 may be connected to the kth scan line SLk, the first electrode thereof may be connected to the second electrode of the driving transistor DT, and the second electrode thereof may be connected to the jth data line Dj.

The fourth transistor ST4 is turned on by the scan signal of the k+1th scan line SLk to connect the anode electrode of the light emitting element EL to the initialization voltage line VIL. The anode electrode of the light emitting element EL may be discharged to an initialization voltage. The gate electrode of the fourth transistor ST4 may be connected to the k+1th scan line SLk, the first electrode thereof may be connected to the anode electrode of the light emitting element EL, and the second electrode thereof may be connected to the initialization voltage line VIL.

The fifth transistor ST5 is turned on by the light emission control signal of the kth light emission line Ek to connect the first electrode of the driving transistor DT to the first driving voltage line VDDL. The gate electrode of the fifth transistor ST5 may be connected to the kth light emission line Ek, the first electrode thereof may be connected to the first driving voltage line VDDL, and the second electrode thereof may be connected to the source electrode of the driving transistor DT.

The sixth transistor ST6 is connected between the second electrode of the driving transistor DT and the anode electrode of the light emitting element EL. The sixth transistor ST6 is turned on by the light emission control signal of the kth light emission line Ek to connect the second electrode of the driving transistor DT to the anode electrode of the light emitting element EL. The gate electrode of the sixth transistor ST6 may be connected to the kth light emission line Ek, the first electrode thereof may be connected to the second electrode of the driving transistor DT, and the second electrode thereof may be connected to the anode electrode of the light emitting element EL. When both the fifth transistor ST5 and the sixth transistor ST6 are turned on, the driving current Ids may be supplied to the light emitting element EL.

The first capacitor C1 is formed between the gate electrode of the driving transistor DT and the first driving voltage line VDDL. The first electrode of the first capacitor C1 may be connected to the gate electrode of the driving transistor DT, and the second electrode may be connected to the first driving voltage line VDDL.

When the first electrode of each of the first to sixth transistors ST1, ST2, ST3, ST4, ST5, ST6, and the driving transistor DT is a source electrode, the second electrode thereof may each be a drain electrode. In one alternative embodiment, when the first electrode of each of the first to sixth transistors ST1, ST2, ST3, ST4, ST5, ST6, and the driving transistor DT is a drain electrode, the second electrode thereof may each be a source electrode.

The active layer of each of the first to sixth transistors ST1, ST2, ST3, ST4, ST5, ST6, and the driving transistor DT may be formed of at least one of polysilicon, amorphous silicon, and an oxide semiconductor. When the semiconductor layer of each of the first to sixth transistors ST1, ST2, ST3, ST4, ST5, ST6, and the driving transistor DT is formed of polysilicon, the semiconductor layer thereof may be formed of low-temperature polysilicon (LTPS).

Although it is shown in FIG. 7 that the first to sixth transistors ST1, ST2, ST3, ST4, ST5, ST6, and the driving transistor DT are formed as P-type metal oxide semiconductor field effect transistors (MOSFETs), the present disclosure is not limited thereto, and they may be formed as N-type MOSFETs.

The first driving voltage of the first driving voltage line VDDL, the second driving voltage of the second driving voltage line VSSL, and the initialization voltage of the initialization voltage line VIL may be set in consideration of characteristics of the driving transistor DT and characteristics of the light emitting element EL. For example, the voltage difference between the initialization voltage and the data voltage supplied to the source electrode of the driving transistor DT may be set to be smaller than the threshold voltage of the driving transistor DT.

Figure 8:
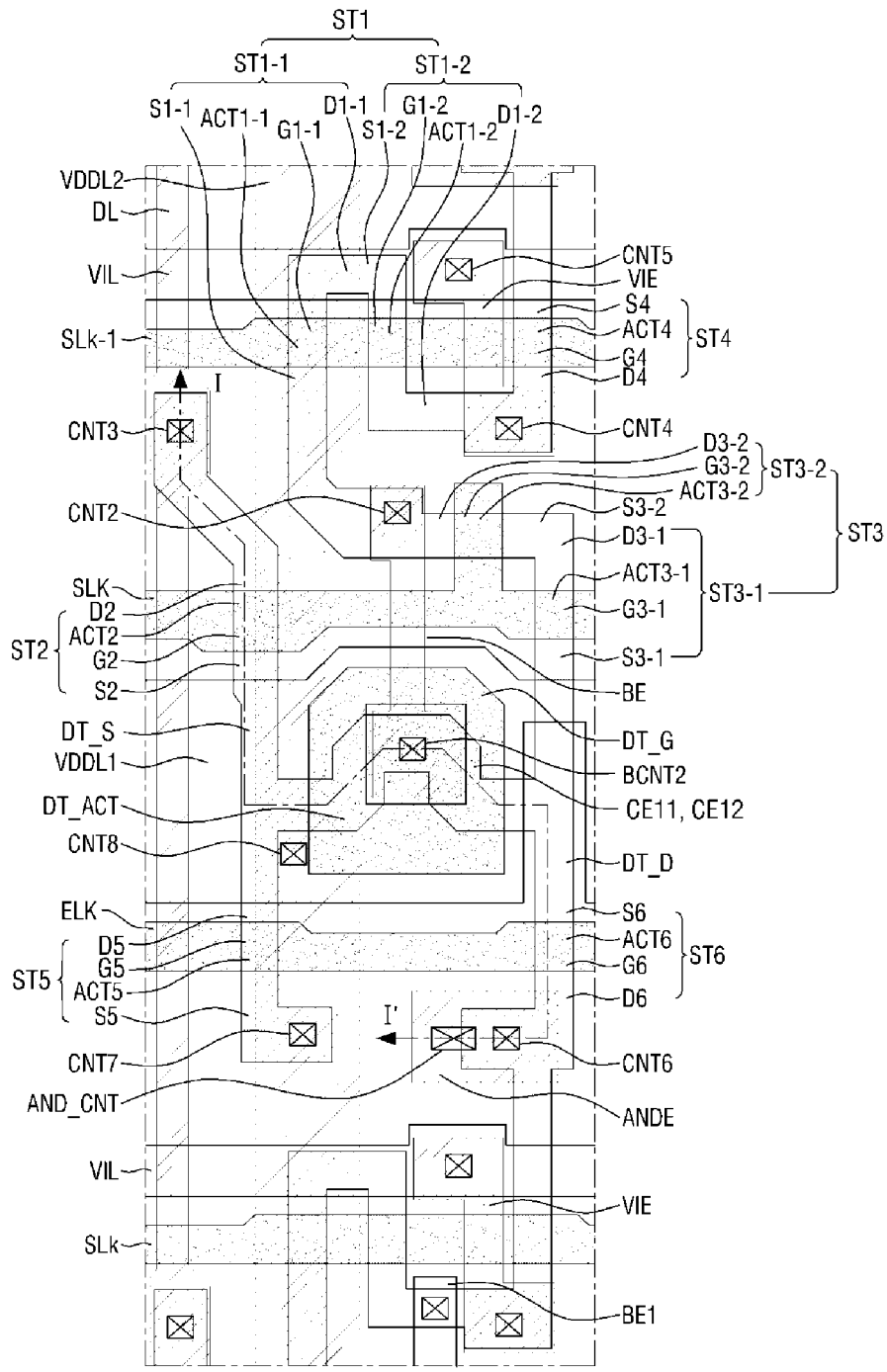
FIG. 8 is a plan view specifically showing an auxiliary pixel according to an embodiment.

FIG. 8 is a plan view specifically showing a pixel circuit according to an embodiment.

Referring to FIG. 8, the pixel circuit PC may include a driving transistor DT, first to sixth transistors ST1 to ST6, and a first capacitor C1.

The driving transistor DT may include an active layer DT_ACT, a gate electrode DT_G, a first electrode DT_S, and a second electrode DT_D. The active layer DT_ACT of the driving transistor DT may overlap the gate electrode DT_G of the driving transistor DT. The gate electrode DT_G may be disposed on the active layer DT_ACT of the driving transistor DT.

The first electrode DT_S of the driving transistor DT may be connected to the first electrode S2 of the second transistor ST2. The second electrode DT_D of the driving transistor DT may be connected to the first electrode S3-1 of the 3-1 transistor ST3-1 and the first electrode S6 of the sixth transistor ST6.

The first transistor ST1 may be formed as a dual transistor. The first transistor ST1 may include a first-first transistor ST1-1 and a first-second transistor ST1-2.

The first-first transistor ST1-1 may include an active layer ACT1-1, a gate electrode G1-1, a first electrode S1-1, and a second electrode D1-1. The gate electrode G1-1 of the first-first transistor ST1-1, which is a part of the k−1 scan line SLk-1, may be an overlapping region between the active layer ACT1-1 of the first-first transistor ST1-1 and the k−1th scan line SLk-1. The first electrode S1-1 of the first-first transistor ST1-1 may be connected to a connection electrode BE of the driving transistor DT through a second contact hole CNT2. The second electrode D1-1 of the first-first transistor ST1-1 may be connected to the first electrode S1-2 of the first-second transistor ST1-2.

The first-second transistor ST1-2 may include an active layer ACT1-2, a gate electrode G1-2, a first electrode S1-2, and a second electrode D1-2. The gate electrode G1-2 of the first-second transistor ST1-2, which is a part of the k−1 scan line SLk-1, may be an overlapping region between the active layer ACT1-2 of the first-second transistor ST1-2 and the k−1th scan line SLk-1. The first electrode S1-2 of the first-second transistor ST1-2 may be connected to the second electrode D1-1 of the first-first transistor ST1-1. The second electrode D1-2 of the first-second transistor ST1-2 may be connected to an initialization connection electrode VIE through a fourth contact hole CNT4.

The second transistor ST2 may include an active layer ACT2, a gate electrode G2, a first electrode S2, and a second electrode D2. The gate electrode G2 of the second transistor ST2, which is a part of the kth scan line SLk (k is a positive integer of 2 or more), may be an overlapping region between the active layer ACT2 of the second transistor ST2 and the kth scan line SLk. The first electrode S2 of the second transistor ST2 may be connected to the first electrode DT_S of the driving transistor DT. The second electrode D2 of the second transistor ST2 may be connected to the jth data line DL through a third contact hole CNT3.

The third transistor ST3 may be formed as a dual transistor. The third transistor ST3 may include a third-first transistor ST3-1 and a third-second transistor ST3-2.

The third-first transistor ST3-1 may include an active layer ACT3-1, a gate electrode G3-1, a first electrode S3-1, and a second electrode D3-1. The gate electrode G3-1 of the third-first transistor ST3-1, which is a part of the kth scan line SLk, may be an overlapping region between the active layer ACT3-1 of the third-first transistor ST3-1 and the kth scan line SLk. The first electrode S3-1 of the third-first transistor ST3-1 may be connected to the second electrode S3-2 of the third-second transistor ST3-2. The first electrode S3-1 of the third-first transistor ST3-1 may be connected to the second electrode DT_D of the driving transistor DT. The second electrode D3-1 of the third-first transistor ST3-1 may be connected to the first electrode S3-2 of the third-second transistor ST3-2.

The third-second transistor ST3-2 may include an active layer ACT3-2, a gate electrode G3-2, a first electrode S3-2, and a second electrode D3-2. The gate electrode G3-2 of the third-second transistor ST3-2, which is a part of the kth scan line SLk, may be an overlapping region between the active layer ACT3-2 of the third-second transistor ST3-2 and the k-th scan line SLk. The second electrode D3-2 of the third-second transistor ST3-2 may be connected to the connection electrode BE through the second contact hole CNT2.

The fourth transistor ST4 may include an active layer ACT4, a gate electrode G4, a first electrode S4, and a second electrode D4. The gate electrode G4 of the fourth transistor ST4, which is a part of the k−1th scan line SLk-1, may be an overlapping region between the active layer ACT4 of the fourth transistor ST4 and the k–1th scan line SLk-1. The first electrode S4 of the fourth transistor ST4 may be connected to an anode connection electrode ANDE through a sixth contact hole CNT6. The anode electrode AND of the light emitting element may be connected to the anode connection electrode ANDE through an anode contact hole AND_CNT. The second electrode D4 of the fourth transistor ST4 may be connected to the initialization connection electrode VIE through the fourth contact hole CNT4. The initialization voltage line VIL may be connected to the initialization connection electrode VIE through the fifth contact hole CNT5, and the initialization connection electrode VIE may be connected to the second electrode D3-2 of the first-second transistor ST1-2 and the second electrode D4 of the fourth transistor ST4 through the fourth contact hole CNT4. The initialization connection electrode VIE may be disposed to intersect the k–1th scan line SLk-1.

The fifth transistor ST5 may include an active layer ACT5, a gate electrode G5, a first electrode S5, and a second electrode D5. The gate electrode G5 of the fifth transistor ST5, which is a part of the kth light emission control line ELk, may be an overlapping region between the active layer ACT5 of the fifth transistor ST5 and the kth light emission control line ELk. The first electrode S5 of the fifth transistor ST5 may be connected to a second driving voltage line VDDL2 through a seventh contact hole CNT7. The second electrode D5 of the fifth transistor ST5 may be connected to the first electrode DT_S of the driving transistor DT.

The sixth transistor ST6 may include an active layer ACT6, a gate electrode G6, a first electrode S6, and a second electrode D6. The gate electrode G6 of the sixth transistor ST6, which is a part of the kth light emission control line ELk, may be an overlapping region between the active layer ACT6 and the kth light emission control line ELk of the sixth transistor ST6. The first electrode S6 of the sixth transistor ST6 may be connected to the second electrode DT_D of the driving transistor DT. The second electrode D6 of the sixth transistor ST6 may be connected to the anode electrode AND of the light emitting element through the sixth contact hole CNT6.

The first electrode CE11 of the first capacitor C1 may be a part of the gate electrode DT_G of the driving transistor DT, and the second electrode CE12 of the first capacitor C1 may be a first driving voltage line VDDL1 overlapping the gate electrode DT_G of the driving transistor DT. The first driving voltage line VDDL1 may be connected to a second driving voltage line VDDL2 through the eighth contact hole CNT8. The second driving voltage line VDDL2 may be disposed in parallel with the jth data line DL, and the first driving voltage line VDDL1 may be disposed in parallel with the kth scan line SLk.

Figure 9:
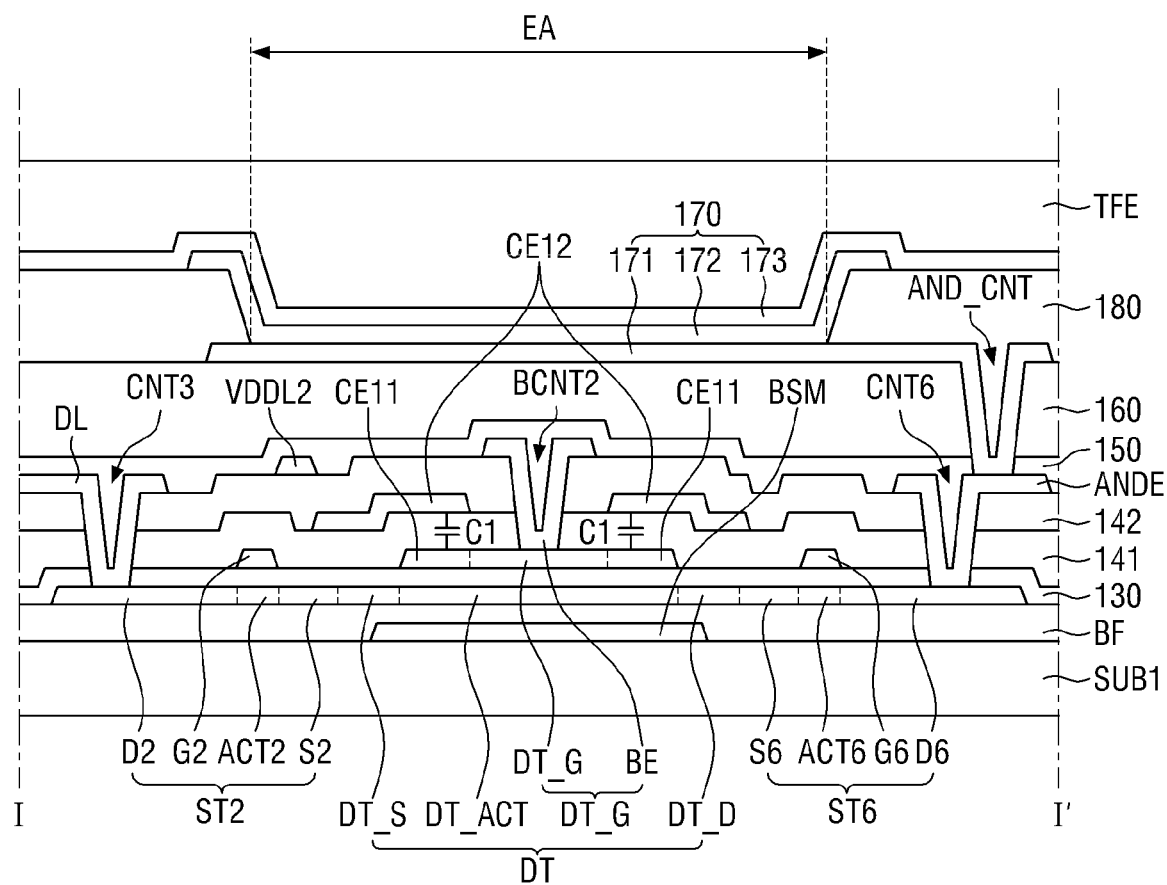
FIG. 9 is a cross-sectional view taken along the line I-I' of FIG. 8.

FIG. 9 is a cross-sectional view taken along the line I-I' of FIG. 8.

Referring to FIGS. 8 and 9, a thin film transistor layer TFTL, a light emitting element layer EML, and an encapsulation layer TFE may be sequentially formed on a first substrate SUB1.

The thin film transistor layer TFTL includes a lower metal layer BSM, a buffer film BF, an active layer ACT, a first gate layer GTL1, a second gate layer GTL2, a gate insulating layer 130, a first interlayer insulating film 141, a first data metal layer DTL1, a second interlayer insulating film 142, a second data metal layer DTL2, a protective film 150, and a planarization film 160.

The lower metal layer BSM may be formed on one surface of the first substrate SUB1. The lower metal layer BSM may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof. According to an embodiment, the lower metal layer BSM may be disposed under the thin film transistor to reduce or prevent the deterioration of characteristics of the thin film transistor due to light emitted from the sensor device SS.

The buffer film BF may be formed on the lower metal layer BSM. The buffer film BF may be formed on one surface of the first substrate SUB1 to protect the thin film transistors 120 and the organic light emitting layer 172 of the light emitting element layer EML from moisture penetrating through the first substrate SUB1 vulnerable to moisture permeation. The buffer film BF may be formed of a plurality of inorganic layers that are alternately stacked. For example, the buffer film BF may be formed as a multi-layer film in which one or more inorganic layers of a silicon nitride layer, a silicon oxynitride layer, a silicon oxide layer, a titanium oxide layer, and an aluminum oxide layer are alternately stacked. The buffer film BF may be omitted.

The active layer ACT may be formed on the first substrate SUB1 or the buffer layer BF. The active layer ACT may include polycrystalline silicon, monocrystalline silicon, low-temperature polycrystalline silicon, amorphous silicon, and/or an oxide semiconductor. When the active layer ACT is made of polycrystalline silicon, the ion-doped active layer ACT may have conductivity. Thus, the active layer ACT may include not only active layers DT_ACT and ACT1 to ACT6 of a driving transistor DT and first to sixth switching transistors ST1 to ST6, but also source electrodes DT_S, S1, S2-1, S2-2, S3-1, S3-2, S4, S5, S6 and drain electrodes DT_D, D1, D2-1, D2-2, D3-1, D3-2, D4, D5, D6.

The gate insulating film 130 may be formed on the active layer ACT. The gate insulating film 130 may be formed of an inorganic layer, for example, a silicon nitride layer, a silicon oxynitride layer, a silicon oxide layer, a titanium oxide layer, and/or an aluminum oxide layer.

The first gate layer GTL1 may be formed on the gate insulating layer 130. The first gate layer GTL1 may include not only a gate electrodes DT_G of the driving transistor DT and gate electrodes G1 to G6 of the first to sixth switching transistors ST1 to ST6, but also scan lines SLK-1 and SLK and light emission control lines ELK. The first gate layer GTL1 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

The first interlayer insulating film 141 may be formed on the first gate layer GTL1. The first interlayer insulating film 141 may be formed of an inorganic layer, for example, a silicon nitride layer, a silicon oxynitride layer, a silicon oxide layer, a titanium oxide layer, and/or an aluminum oxide layer. The first interlayer insulating film 141 may include a plurality of inorganic layers.

The second gate layer GTL2 may be formed on the first interlayer insulating film 141. The second gate layer GTL2 may include an initialization voltage line VIL and a first driving voltage line VDDL1. The second gate layer GTL2 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

The second interlayer insulating film 142 may be formed on the second gate layer GTL2. The second interlayer insulating film 142 may be formed of an inorganic layer, for example, a silicon nitride layer, a silicon oxynitride layer, a silicon oxide layer, a titanium oxide layer, and/or an aluminum oxide layer. The second interlayer insulating film 142 may include a plurality of inorganic layers.

The first data metal layer DTL1 may be formed on the second interlayer insulating film 142. The first data metal layer DTL1 may include data lines DL, second driving voltage lines VDDL2, a connection electrode BE, an anode connection electrode ANDE, and an initialization connection electrode VIE. The first data metal layer DTL1 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

The planarization film 160 may be formed on the first data metal layer DTL1 to planarize the steps due to the active layer ACT, the first gate layer GTL1, the second gate layer GTL2, and the first data metal layer DTL1. The planarization film 160 may be formed as an organic film including acrylic resin, epoxy resin, phenolic resin, polyamide resin, and/or polyimide resin.

Meanwhile, the protective film 150 may be additionally formed between the first data metal layer DTL1 and the planarization film 160. The protective film 150 may be formed of an inorganic layer, for example, a silicon nitride layer, a silicon oxynitride layer, a silicon oxide layer, a titanium oxide layer, and/or an aluminum oxide layer.

Figure 11:
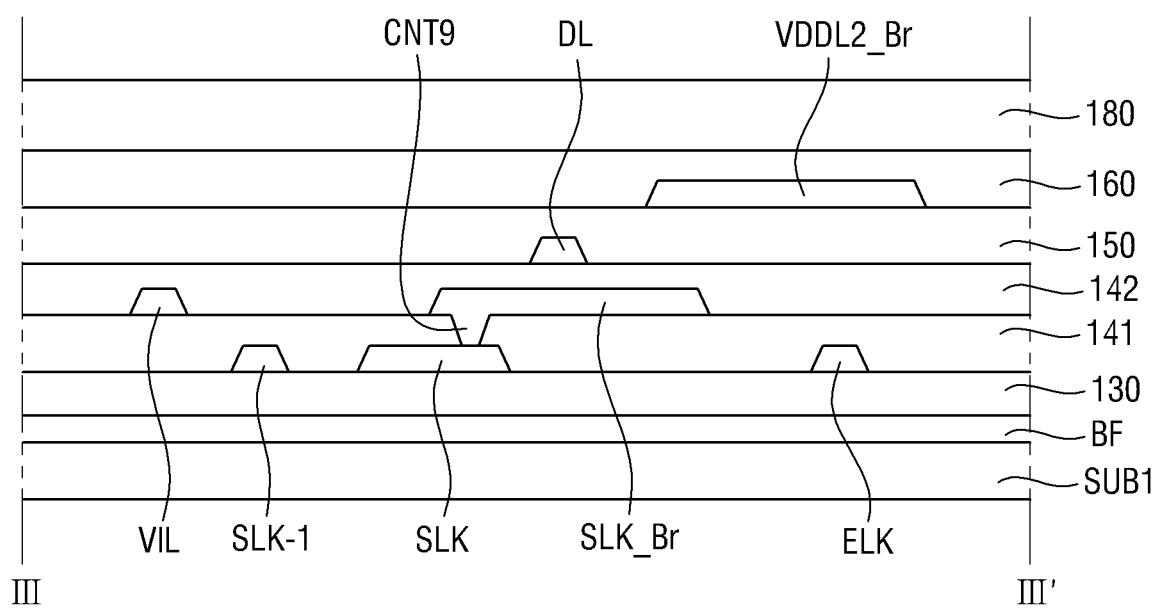
FIG. 11 is a cross-sectional view taken along the line III-III' of FIG. 10.
Figure 12:
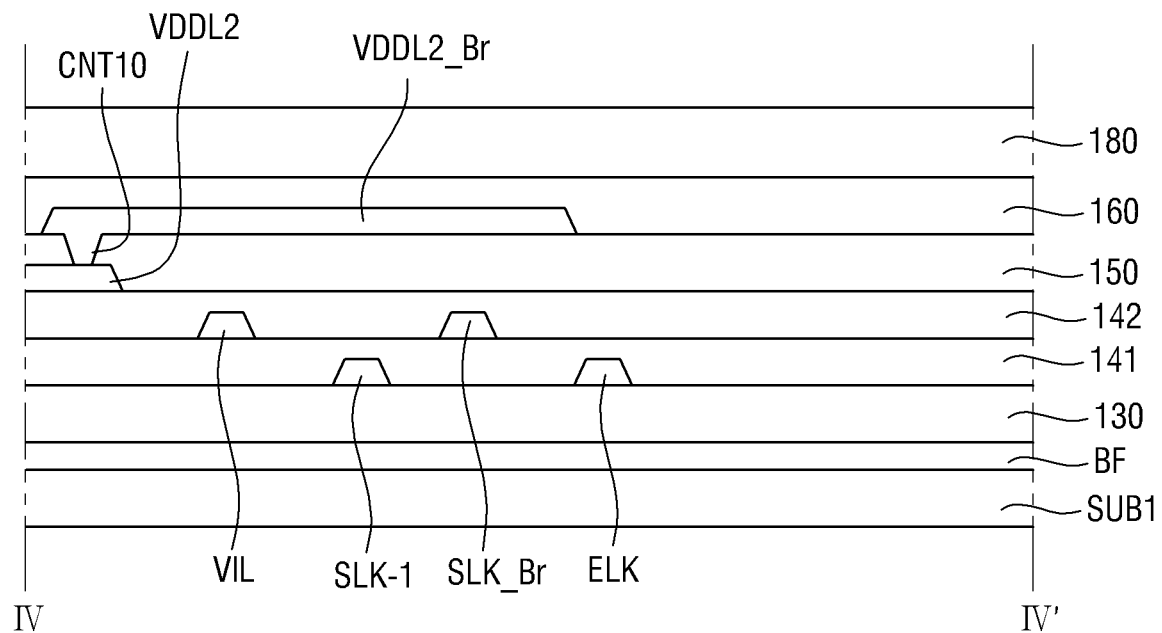
FIG. 12 is a cross-sectional view taken along the line IV-IV' of FIG. 10.

Referring to FIGS. 11 and 12, the second data metal layer DTL2 may be formed on the protective film 150. The second data metal layer DTL2 may include a connection wiring VDDL2_Br of a second driving voltage line, which will be described later. The second data metal layer DTL2 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

Referring to FIGS. 8 and 9 again, as shown in FIG. 8, the driving transistor DT and the first to sixth transistors ST1 to ST6 are formed in a top gate method (e.g., a top gate configuration) in which a gate electrode is located over the active layer. However, the present disclosure is not limited thereto. That is, the driving transistor DT and the first to sixth transistors ST1 to ST6 may be formed in a bottom gate method (e.g., a bottom gate configuration) in which a gate electrode is located under the active layer or a double gate method (e.g., a double gate configuration) in which a gate electrode located both over the active layer and under the active layer.

As shown in FIG. 9, the second connection contact hole BCNT2 may be a hole penetrating through the first interlayer insulating film 141 and the second interlayer insulating film 142 to expose the gate electrode DT_G of the driving transistor DT.

The second contact hole CNT2 may be a hole penetrating through the gate insulating film 130, the first interlayer insulating film 141, and the second interlayer insulating film 142 to expose the second electrode D3-1 of the third-first transistor ST3-1. The connection electrode BE may be connected to the second electrode D3-1 of the third-first transistor ST3-1 through the second contact hole CNT2.

The third contact hole CNT3 may be a hole penetrating through the gate insulating film 130, the first interlayer insulating film 141, and the second interlayer insulating film 142 to expose the first electrode S2 of the second transistor ST2. The jth data line DL may be connected to the first electrode S2 of the second transistor ST2 through the third contact hole CNT3.

The fourth contact hole CNT4 may be a hole penetrating through the gate insulating film 130, the first interlayer insulating film 141, and the second interlayer insulating film 142 to expose the second electrode D1 of the first transistor ST1 and the second electrode D4 of the fourth transistor ST4. The initialization connection electrode VIE may be connected to the first-second electrode D1-2 of the first-second transistor ST1-2 and the second electrode D4 of the fourth transistor ST4 through the fourth contact hole CNT4.

The fifth contact hole CNT5 may be a hole penetrating through the second interlayer insulating film 142 to expose the initialization voltage line VIL. The initialization connection electrode VIE may be connected to the initialization voltage line VIL through the fifth contact hole CNT5.

The sixth contact hole CNT6 may be a hole penetrating through the gate insulating film 130, the first interlayer insulating film 141, and the second interlayer insulating film 142 to expose the second electrode D6 of the sixth transistor ST6. The anode connection electrode ANDE may be connected to the second electrode D6 of the sixth transistor ST6 through the sixth contact hole CNT6.

The seventh contact hole CNT7 may be a hole penetrating through the gate insulating film 130, the first interlayer insulating film 141, and the second interlayer insulating film 142 to expose the first electrode S5 of the fifth transistor ST5. The second driving voltage line VDDL2 may be connected to the first electrode S5 of the fifth transistor ST5 through the seventh contact hole CNT7.

The eighth contact hole CNT8 may be a hole penetrating through the second interlayer insulating film 142 to expose the first driving voltage line VDDL1. The second driving voltage line VDDL2 may be connected to the first driving voltage line VDDL1 through the eighth contact hole CNT8.

The anode contact hole AND_CNT may be a hole penetrating through the protective film 150 and the planarization film 160 to expose the anode connection electrode ANDE.

The light emitting element layer EML is formed on the thin film transistor layer TFTL. The light emitting element layer EML includes light emitting elements 170 and a pixel defining film 180.

The light emitting elements 170 and the pixel defining film 180 are formed on the planarization film 160. Each of the light emitting elements 170 may include a first electrode 171, an organic light emitting layer 172, and a second electrode 173.

The first electrode 171 may be formed on the planarization film 160. The first electrode 171 may be connected to the anode connection electrode ANDE through the anode contact hole AND_CNT penetrating through the protective film 150 and the planarization film 160.

In the top emission structure in which light is emitted toward the second electrode 173 based on the organic light emitting layer 172, the first electrode 171 may be formed of a material having high reflectivity such as a laminate structure (Ti/Al/Ti) of aluminum and titanium, a laminate structure (ITO/Al/ITO) of aluminum and ITO, an APC alloy, or a laminate structure (ITO/APC/ITO) of an APC alloy and ITO. The APC alloy is an alloy of silver (Ag), palladium (Pd), and copper (Cu).

The pixel defining film 180 may be formed to partition the first electrode 171 on the planarization film 160 in order to define the light emitting area EA of each of the auxiliary pixels Pa. The pixel defining film 180 may be formed to cover the edge of the first electrode 171. The planarization film 160 may be formed as an organic film including acrylic resin, epoxy resin, phenolic resin, polyamide resin, or polyimide resin.

The light emitting area EA of each of the auxiliary pixels Pa refers to an area in which the first electrode 171, the organic light emitting layer 172, and the second electrode 173 are sequentially stacked, and holes from the first electrode 171 are combined with electrons from the second electrode to emit light.

The organic light emitting layer 172 is formed on the first electrode 171 and the pixel defining film 180. The organic light emitting layer 172 may include an organic material to emit light of a set or predetermined color. For example, the organic light emitting layer 172 may include a hole transporting layer, an organic material layer, and an electron transporting layer.

The second electrode 173 is formed on the organic light emitting layer 172. The second electrode 173 may be formed to cover the organic light emitting layer 172. The second electrode 173 may be a common layer commonly formed in sub-pixels SP1, SP2, and SP3. A capping layer may be formed on the second electrode 173.

In the top emission structure, the second electrode 173 may be formed of a transparent conductive material (TCO) such as ITO and/or IZO that can transmit light, or may be formed of a semi-transmissive conductive material such as magnesium (Mg), silver (Ag), or an alloy thereof. When the second electrode 173 is formed of a semi-transmissive conductive material, light emission efficiency can be increased by microcavities (e.g., by including microcavities).

The thin film encapsulation layer TFE may be formed on the light emitting element layer EML. The thin film encapsulation layer TFE may include at least one inorganic film to prevent or substantially prevent oxygen and/or moisture from penetrating into the light emitting element layer EML. Further, the thin film encapsulation layer TFE may include at least one organic layer to protect the light emitting element layer EML from foreign matter such as dust.

In one alternative embodiment, a second substrate, instead of the thin film encapsulation layer TFE, is disposed on the light emitting element layer EML, and a space between the light emitting element layer EML and the second substrate is empty in a vacuum state, or is filled with a charging film. The charging film may be an epoxy charging film and/or a silicon charging film.

Figure 10:
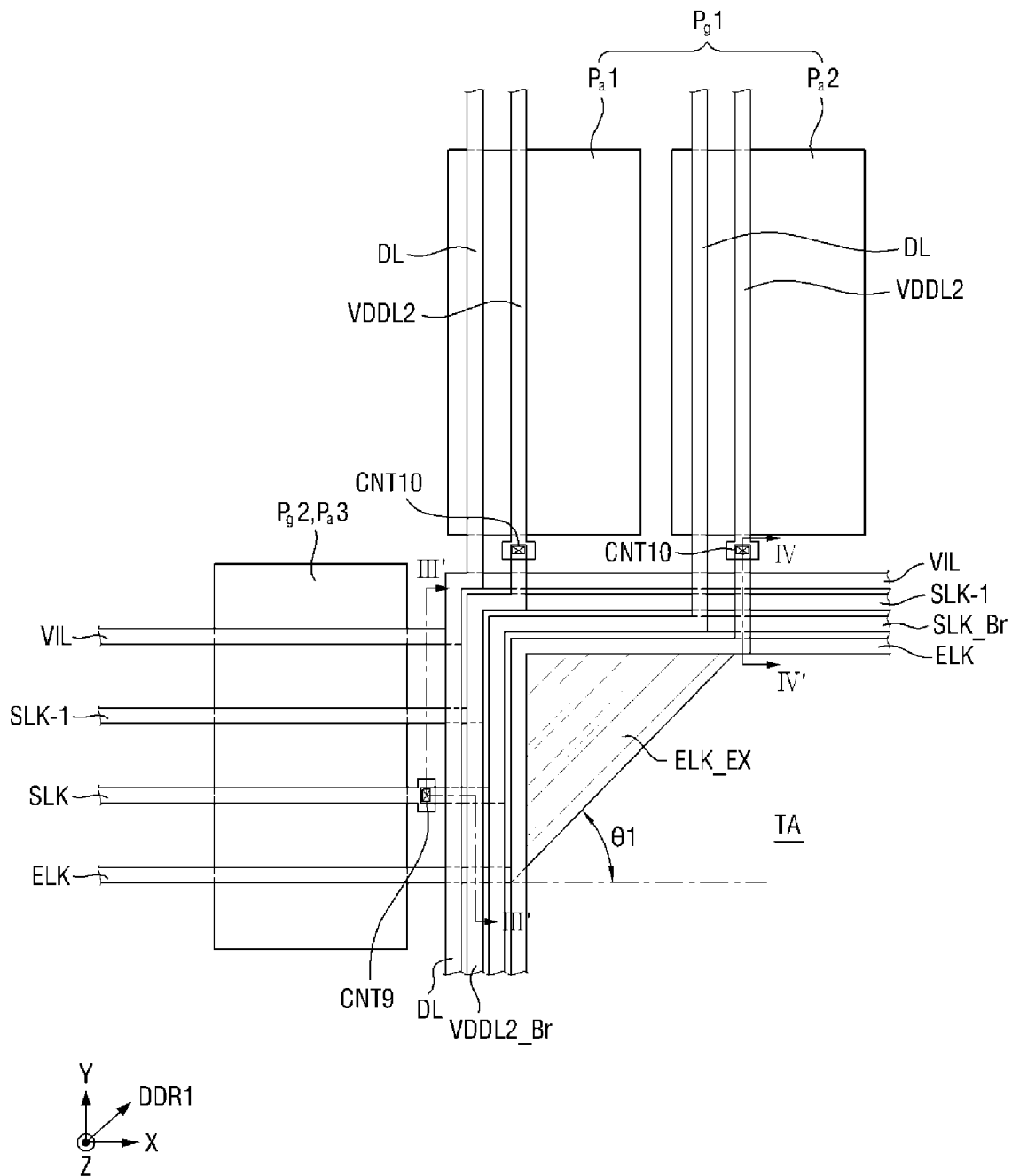
FIG. 10 is an enlarged view of the area A of FIG. 4 according to an embodiment.

FIG. 10 is an enlarged view of the area A of FIG. 4 according to an embodiment, FIG. 11 is a cross-sectional view taken along the line III-III' of FIG. 10, and FIG. 12 is a cross-sectional view taken along the line IV-IV' of FIG. 10.

Referring to FIGS. 4 and 10 to 12, at least one transmission portion TA may be surrounded by a plurality of auxiliary pixels Pa. The plurality of auxiliary pixels Pa may be electrically connected to each other by a plurality of wirings VIL, SLK-1, SLK, ELK, DL, and VDDL2.

According to an embodiment, the transmission portion TA may have a rectangular shape before the plurality of wirings VIL, SLK-1, SLK, ELK, DL, and VDDL2 are arranged, and the plurality of wirings VIL, SLK-1, SLK, ELK, DL, and VDDL2 may be arranged in two rows and four columns. As shown in FIG. 10, an auxiliary pixel Pa1 corresponding to the second row and first column of the first pixel group Pg1, an auxiliary pixel Pa2 corresponding to the second row and second column of the first pixel group Pg1, and an auxiliary pixel Pa3 corresponding to the first row and fourth column of the second pixel group Pg2 may be arranged around one vertex of the transmission portion TA having a rectangular shape.

The data line DL and the second driving voltage line VDDL2 may extend in the second direction (Y direction) on the auxiliary pixel Pa1 corresponding to the second row and first column of the first pixel group Pg1, and the data line DL and the second driving voltage line VDDL2 may extend in the second direction (Y direction) on the auxiliary pixel Pa2 corresponding to the second row and second column of the first pixel group Pg1. The initialization voltage line VIL, the first scan line SLK-1, the second scan line SLK, and the light emission control line ELK may extend in the first direction (X direction) on the auxiliary pixel Pa3 corresponding to the first row and fourth column of the second pixel group Pg2.

In order to ensure the maximum transmittance of the transmission portion TA, the plurality of wirings VIL, SLK-1, SLK, ELK, DL, and VDDL2 may be arranged along the edge of the transmission portion TA. Meanwhile, the second electrode 173 may not be disposed on the transmission portion TA. For convenience of explanation, although it is shown in the drawings that the initialization voltage line VIL, the first scan line SLK-1, the second scan line SLK, and the light emission control line ELK, extending in the first direction (X direction), are arranged to be spaced apart from each other by a set or predetermined interval, the plurality of wirings VIL, SLK-1, SLK, ELK, DL, and VDDL2 may be arranged without being spaced apart from each other in a plan view.

According to an embodiment, the initialization voltage line VIL may be formed of the second gate layer GTL2 formed on a first interlayer insulating film 141 on both the auxiliary pixel Pa3 and the transmission portion TA. The first scan line SLK-1 may be formed of the first gate layer GTL1 formed on the gate insulating film 130 on both the auxiliary pixel Pa3 and the transmission portion TA. The second scan line SLK may be formed of the first gate layer GTL1 formed on the gate insulating film 130 on the auxiliary pixel Pa3, and the second scan line connection line SLK_Br may be formed of a second gate layer GTL2 formed on the first interlayer insulating film 141 on the transmission portion TA. The second scan line connection line SLK_Br may be electrically and/or physically connected to the second scan line SLK through a ninth contact hole CNT9 formed in the first interlayer insulating film 141. The light emission control line ELK may be formed of the first gate layer GTL1 formed on the gate insulating film 130 on both the auxiliary pixel Pa3 and the transmission portion TA.

Generally, the initialization voltage line VIL, the first scan line SLK-1, the second scan line SLK, and the light emission control line ELK, extending in the first direction (X direction), may each include a bending portion extending in the second direction (Y direction) intersecting (or crossing) the first direction (X direction) around one vertex of the transmission portion TA.

The light emission control line ELK may include a triangular first extension portion ELK_Ex in a region near the bending portion. The first extension portion ELK_Ex may be concurrently or simultaneously formed of the same material as the light emission control line ELK. For example, the first extension portion ELK_Ex may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

The first extension portion ELK_Ex may include a first hypotenuse facing the bending portion. The angle θ1 of the first hypotenuse to the first direction (X direction) may be the same in the plurality of transmission portions TA. For example, the angle θ1 of the first hypotenuse to the first direction (X direction) may be about 45°.

According to an embodiment, the data line DL may be formed of the first data metal layer DTL1 formed on the second interlayer insulating film 142 on both the auxiliary pixels Pa1 and Pa2 and the transmission portion TA. The second driving voltage line VDDL2 may be formed of the first data metal layer DTL1 formed on the second interlayer insulating film 142 on the auxiliary pixels Pa1 and Pa2. The connection wiring VDDL2_Br of the second driving voltage line may be formed of the second data metal layer DTL2 formed on the protective film 150 on the transmission portion TA. The connection wiring VDDL2_Br of the second driving voltage line may be electrically and/or physically connected to the second driving voltage line VDDL2 through a tenth contact hole CNT10 formed in the protective film 150.

Generally, the data line DL and the second driving voltage line VDDL2, extending in the second direction (Y direction), may include a bending portion extending in the first direction (X direction) intersecting (or crossing) the second direction (Y direction) around one vertex of the transmission portion TA.

The data line DL and the second driving voltage line VDDL2 disposed on the auxiliary pixel Pa1 may be disposed to overlap the initialization voltage line VIL and the first scan line SLK-1 in the third direction (Z direction) at the bending portion, and the data line DL and the second driving voltage line VDDL2 disposed on the auxiliary pixel Pa2 may be disposed to overlap the second scan line SLK and the light emission control line ELK in the third direction (Z direction) at the bending portion. In particular, the second driving voltage line VDDL2 disposed on the auxiliary pixel Pa2 may be disposed to overlap the first extension portion ELK_Ex of the light emission control line ELK in the third direction (Z direction) at the bending portion.

Because the arrangement of the plurality of wirings VIL, SLK-1, SLK, ELK, DL, and VDDL2 at another vertex of the transmission portion TA is symmetrical to the aforementioned contents, hereinafter, a detailed description thereof will be omitted. Because the first triangular extension portion ELK_Ex is disposed at each of the four vertices of the rectangular transmission portion TA, as a result, the transmission portion TA may have a planar octagonal shape. In the octagonal transmission portion TA as compared with the triangular transmission portion TA, the aforementioned diffraction phenomenon may be reduced. Thus, the first extension portion ELK_Ex is further formed in the process of forming the plurality of wirings without an additional separate process, thereby maintaining suitable (e.g., good) detection ability of the sensor device (such as the sensor) disposed under the transmission portion TA.

Hereinafter, other embodiments will be described. In the following embodiments, the same configuration as the embodiment already described will be omitted or simplified, and differences will be mainly described.

Figure 13:
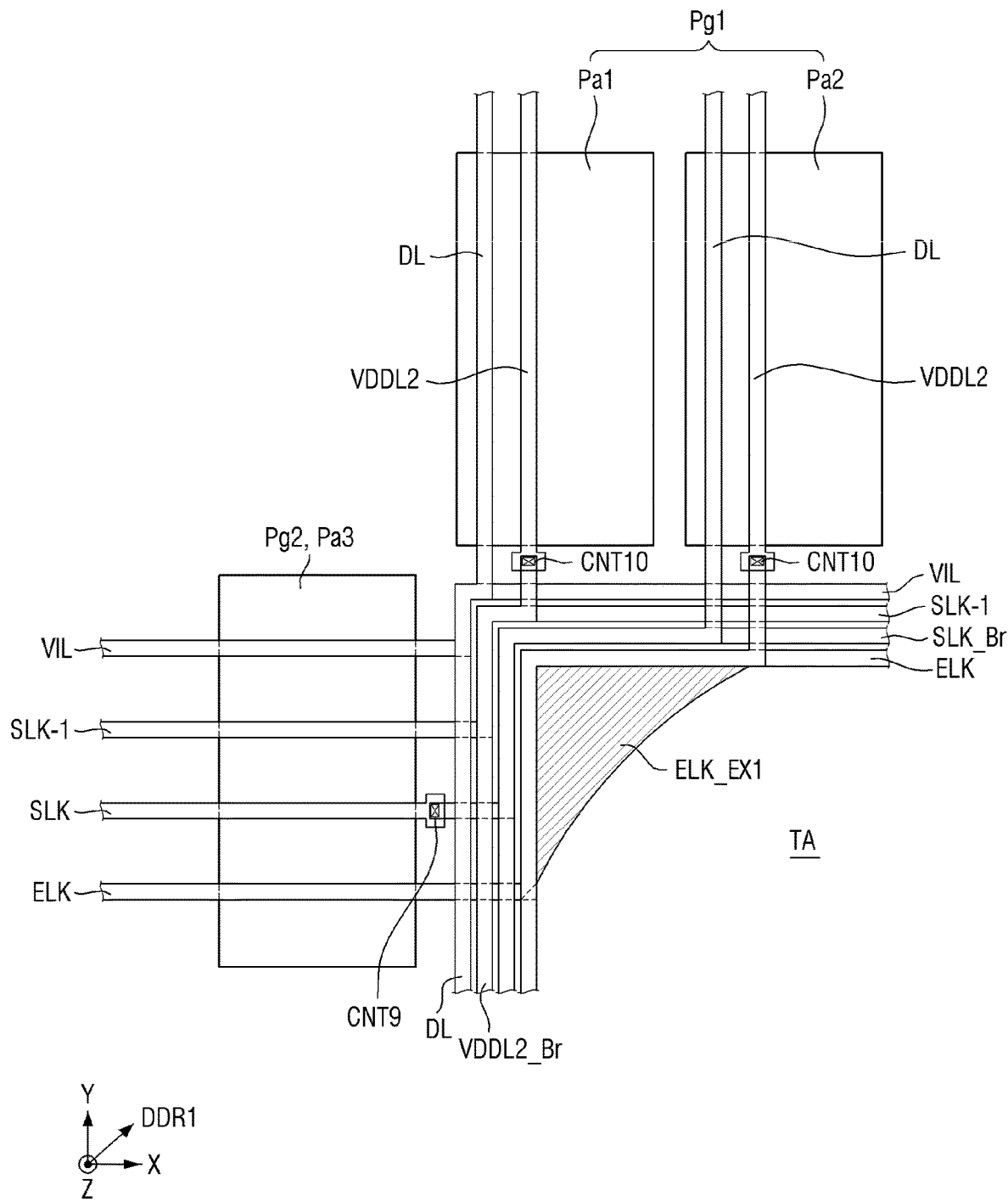
FIG. 13 is an enlarged view of the area A of FIG. 4 according to another embodiment.

FIG. 13 is an enlarged view of the area A of FIG. 4 according to another embodiment.

Referring to FIGS. 11 to 13, a first extension portion ELK_Ex1 of the light emission control line ELK is different from the first extension portion ELK_Ex including a linear hypotenuse of FIG. 12 in that the first extension portion ELK_Ex1 includes a curved hypotenuse.

More specifically, the light emission control line ELK may be formed of the first gate layer GTL1 formed on the gate insulating film 130 on both the auxiliary pixel Pa3 and the transmission portion TA. Generally, the light emission control line ELK extending in the first direction (X direction) includes a bending portion extending in the second direction (Y direction) crossing the first direction (X direction) around one vertex of the transmission portion TA.

The light emission control line ELK may include a first extension portion ELK_Ex1 in a region near the bending portion. The first extension portion ELK_Ex1 may be concurrently or simultaneously formed of the same material as the light emission control line ELK. For example, the first extension portion ELK_Ex1 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

The first extension portion ELK_Ex1 may include a curved side facing the bending portion. The curvature of the curved side may be the same in the plurality of transmission portions TA.

The second driving voltage line VDDL2 may be disposed to overlap the first extension portion ELK_Ex1 of the light emission control line ELK in the third direction (Z direction) at the bending portion.

Because the first extension portion ELK_Ex1 having a curved side is disposed at each of the four vertices of the rectangular transmission portion TA, as a result, the transmission portion TA may have an elliptical or circular shape in a plan view. In the elliptical or circular transmission portion TA as compared with the rectangular transmission portion TA, the aforementioned diffraction phenomenon may be reduced. Thus, the first extension portion ELK_Ex1 is further formed in the process of forming the plurality of wirings without an additional separate process, thereby maintaining suitable (e.g., good) detection ability of the sensor device (such as the sensor) disposed under the transmission portion TA.

Figure 14A:
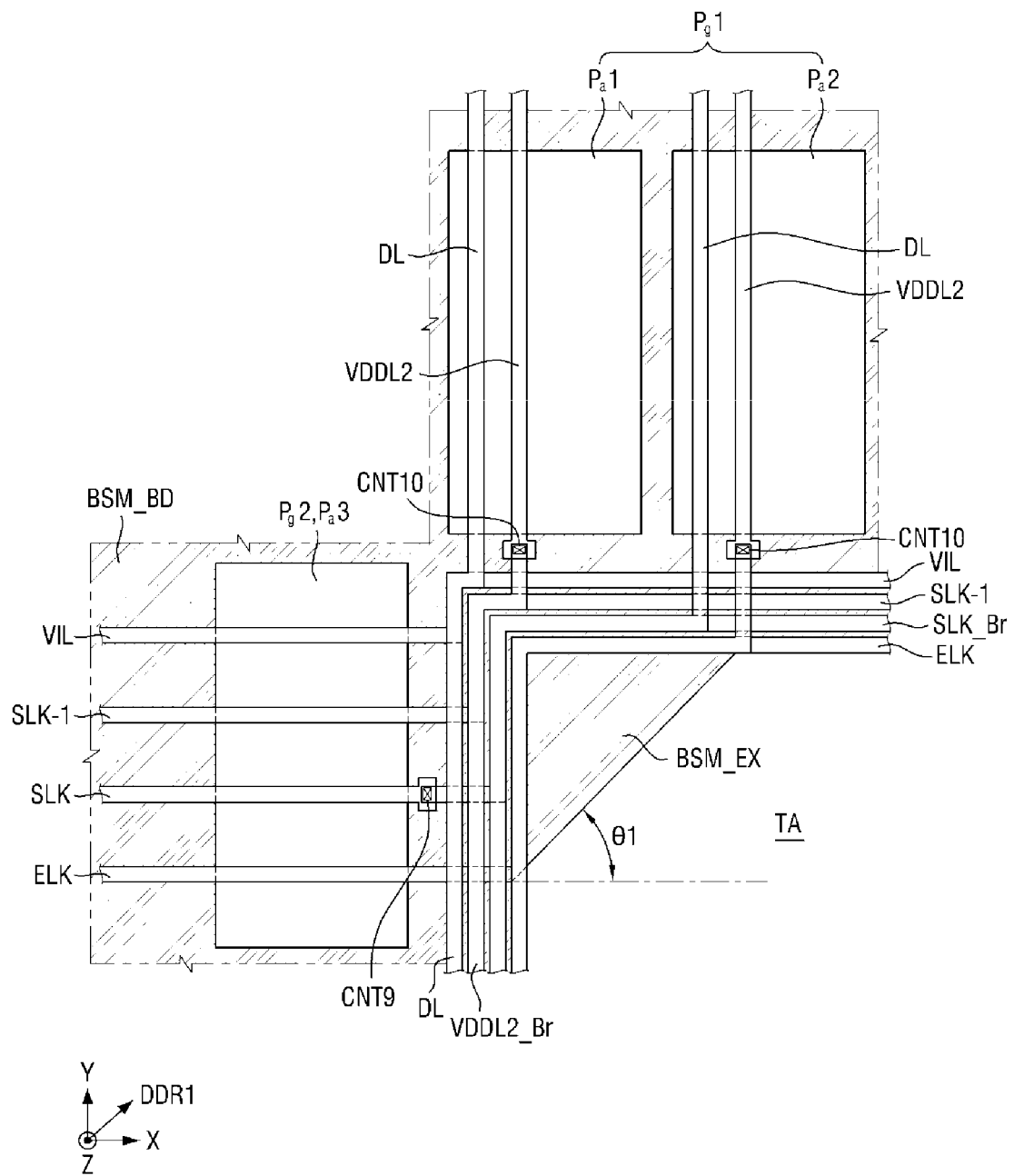
FIGS. 14A and 14B are each an enlarged view of the area A of FIG. 4 according to other embodiments.
Figure 14B:
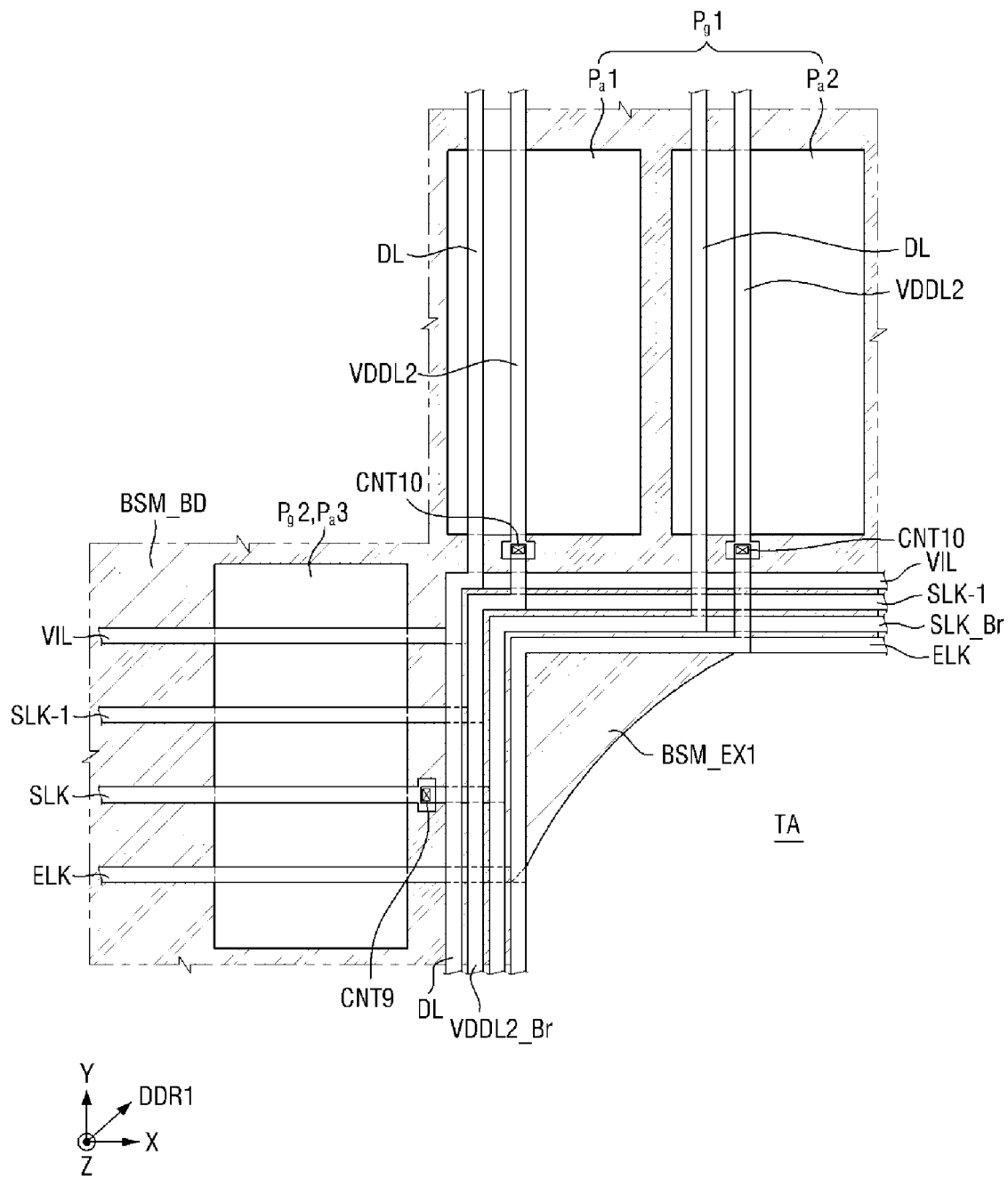

FIGS. 14A and 14B are each an enlarged view of the area A of FIG. 4 according to other embodiments.

Referring to FIGS. 11, 12, 14A, and 14B, the same structures as the first extension portions ELK_Ex and ELK_Ex1 shown in FIGS. 10 and 13 are formed utilizing a lower metal layer BSL, not the light emission control line ELK.

More specifically, the transmission portion TA may have a rectangular shape before the plurality of wirings VIL, SLK-1, SLK, ELK, DL, and VDDL2 are arranged, and the plurality of auxiliary pixels Pa may be arranged in two rows and four columns. As shown in FIGS. 14A and 14B, an auxiliary pixel Pa1 corresponding to the second row and first column of the first pixel group Pg1, an auxiliary pixel Pa2 corresponding to the second row and second column of the first pixel group Pg1, and an auxiliary pixel Pa3 corresponding to the first row and fourth column of the second pixel group Pg2 may be arranged around one vertex of the transmission portion TA having a rectangular shape.

The data line DL and the second driving voltage line VDDL2 may extend in the second direction (Y direction) on the auxiliary pixel Pa1 corresponding to the second row and first column of the first pixel group Pg1, and the data line DL and the second driving voltage line VDDL2 may extend in the second direction (Y direction) on the auxiliary pixel Pa2 corresponding to the second row and second column of the first pixel group Pg1. The initialization voltage line VIL, the first scan line SLK-1, the second scan line SLK, and the light emission control line ELK may extend in the first direction (X direction) on the auxiliary pixel Pa3 corresponding to the first row and fourth column of the second pixel group Pg2.

In order to ensure desired (e.g., the maximum) transmittance of the transmission portion TA, the plurality of wirings VIL, SLK-1, SLK, ELK, DL, and VDDL2 may be arranged along the edge of the transmission portion TA. Meanwhile, the second electrode 173 may not be disposed on the transmission portion TA. For convenience of explanation, although it is shown in the drawings that the initialization voltage line VIL, the first scan line SLK-1, the second scan line SLK, and the light emission control line ELK, extending in the first direction (X direction), are arranged to be spaced apart from each other by a set or predetermined interval, the plurality of wirings VIL, SLK-1, SLK, ELK, DL, and VDDL2 may be arranged without being spaced apart from each other in a plan view.

According to an embodiment, the initialization voltage line VIL may be formed of the second gate layer GTL2 formed on the first interlayer insulating film 141 on both the auxiliary pixel Pa3 and the transmission portion TA. The first scan line SLK-1 may be formed of the first gate layer GTL1 formed on the gate insulating film 130 on both the auxiliary pixel Pa3 and the transmission portion TA. The second scan line SLK may be formed of the first gate layer GTL1 formed on the gate insulating film 130 on the auxiliary pixel Pa3, and the second scan line connection line SLK_Br may be formed of a second gate layer GTL2 formed on the first interlayer insulating film 141 on the transmission portion TA. The second scan line connection line SLK_Br may be electrically and/or physically connected to the second scan line SLK through a ninth contact hole CNT9 formed in the first interlayer insulating film 141. The light emission control line ELK may be formed of the first gate layer GTL1 formed on the gate insulating film 130 on both the auxiliary pixel Pa3 and the transmission portion TA.

Generally, the initialization voltage line VIL, the first scan line SLK-1, the second scan line SLK, and the light emission control line ELK, extending in the first direction (X direction), may include a bending portion extending in the second direction (Y direction) intersecting (or crossing) the first direction (X direction) around one vertex of the transmission portion TA.

The lower metal layer BSM may be disposed on the substrate SUB1. According to an embodiment, the lower metal layer BSM may be disposed over the entire transmission portion TA excluding one region thereof in the sensor area SA. For example, the lower metal layer BSM may include a triangular extension portion BSM_Ex in a region near the body portion BSM_BD and bending portion of the lower metal layer BSM overlapping the plurality of auxiliary pixels Pa and the plurality of wirings VIL, SLK-1, SLK, ELK, DL, and VDDL2 disposed along the edge of the transmission portion TA in the third direction (Z direction).

The body portion BSM_BD and extension portion BSM_Ex of the lower metal layer BSM may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

As shown in FIG. 14A, the extension portion BSM_Ex of the lower metal layer BSM may include a first hypotenuse facing the bending portion. The angle θ1 of the first hypotenuse to the first direction (X direction) may be the same in the plurality of transmission portions TA. For example, the angle θ1 of the first hypotenuse to the first direction (X direction) may be about 45°.

Further, as shown in FIG. 14B, the extension portion BSM_Ex1 of the lower metal layer BSM may include a curved side facing the bending portion. The curvature of the curved side may be the same in the plurality of transmission portions TA.

According to an embodiment, the data line DL may be formed of the first data metal layer DTL1 formed on the second interlayer insulating film 142 on both the auxiliary pixels Pa1 and Pa2 and the transmission portion TA. The second driving voltage line VDDL2 may be formed of the first data metal layer DTL1 formed on the second interlayer insulating film 142 on the auxiliary pixels Pa1 and Pa2. The connection line VDDL2_Br of the second driving voltage line may be formed of the second data metal layer DTL2 formed on the protective film 150 on the transmission portion TA. The connection line VDDL2_Br of the second driving voltage line may be electrically and/or physically connected to the second driving voltage line VDDL2 through the tenth contact hole CNT10 formed in the protective film 150.

Generally, the data line DL and the second driving voltage line VDDL2, extending in the second direction (Y direction), may include a bending portion extending in the first direction (X direction) intersecting (or crossing) the second direction (Y direction) around one vertex of the transmission portion TA.

The data line DL and the second driving voltage line VDDL2 disposed on the auxiliary pixel Pa1 may be disposed to overlap the initialization voltage line VIL and the first scan line SLK-1 in the third direction (Z direction) at the bending portion, and the data line DL and the second driving voltage line VDDL2 disposed on the auxiliary pixel Pa2 may be disposed to overlap the second scan line SLK and the light emission control line ELK in the third direction (Z direction) at the bending portion.

Because the arrangement of the plurality of wirings VIL, SLK-1, SLK, ELK, DL, and VDDL2 at another vertex of the transmission portion TA is symmetrical to the aforementioned contents, hereinafter, a detailed description thereof will be omitted.

When the triangular extension portion BSM_Ex of the lower metal layer BSM is disposed at each of the four vertices of the rectangular transmission portion TA, the transmission portion TA may have an octagonal shape in a plan view, and when the extension portion BSM_Ex1 thereof having a curved side is disposed at each of the four vertices of the rectangular transmission portion TA, the transmission portion TA may have an elliptical or circular shape in a plan view.

In the octagonal transmission portion TA and the elliptical or circular transmission portion TA as compared with the rectangular transmission portion TA, the aforementioned diffraction phenomenon may be reduced. Thus, the body portion BSM_BD and extension portions BSM_Ex and BSM_Ex1 of the lower metal layer BSM are further formed in the process of forming the lower metal layer BSM without an additional separate process, thereby maintaining suitable (e.g., good) detection ability of the sensor device (such as the sensor) disposed under the transmission portion TA.

Figure 15:
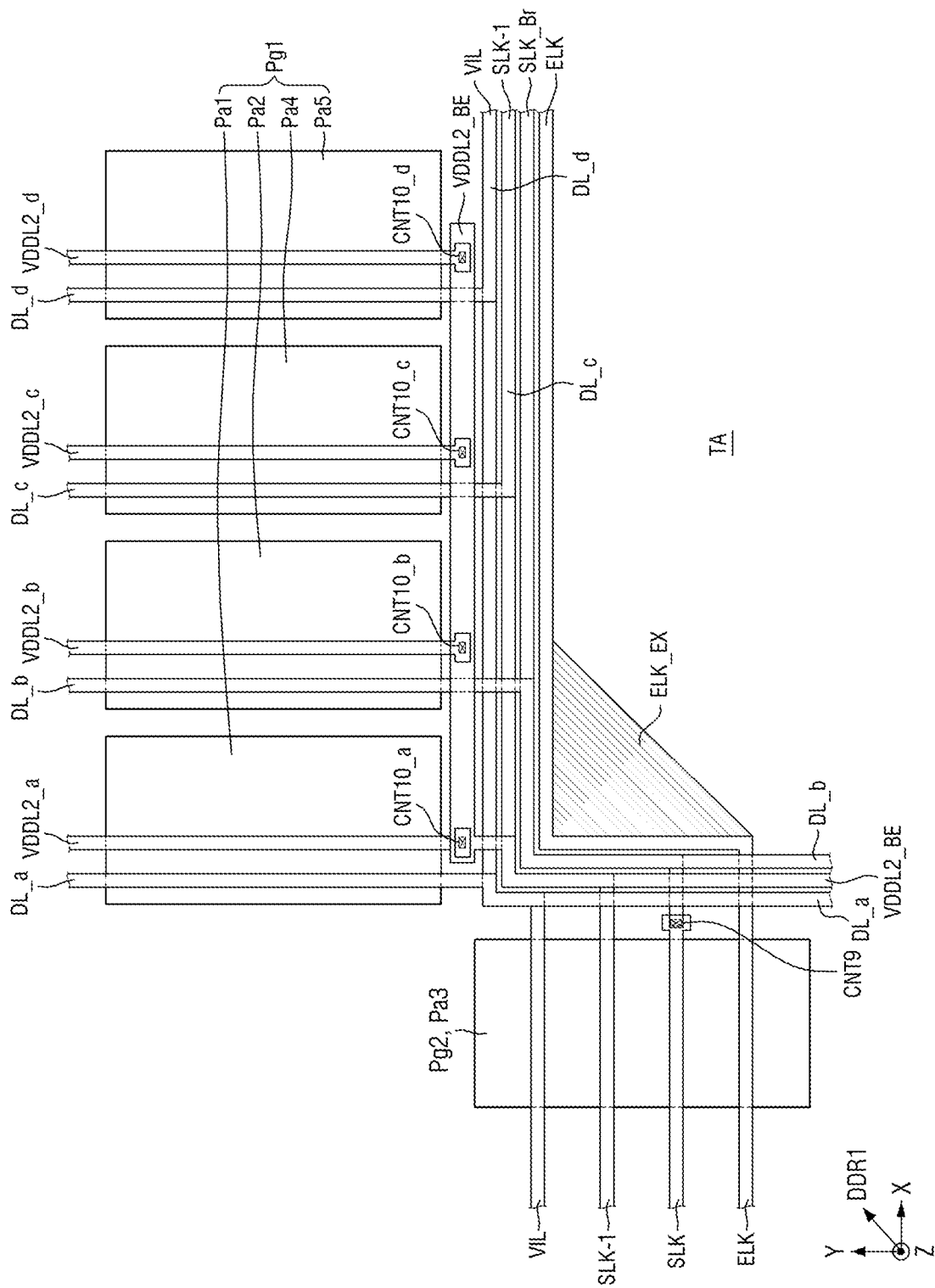
FIG. 15 is an enlarged view of the area B of FIG. 4 according to another embodiment.

FIG. 15 is an enlarged view of the area B of FIG. 4 according to another embodiment.

Referring to FIG. 15, the present embodiment is different from the embodiment shown in FIG. 11 in that an integrated wiring VDDL2_BE of the second driving voltage lines, electrically connecting the plurality of second driving voltage lines VDDL2 to each other, is provided.

More specifically, the plurality of auxiliary pixels Pa may be pixels arranged in two rows and four columns. As shown in FIG. 15, an auxiliary pixel Pa1 corresponding to the second row and first column of the first pixel group Pg1, an auxiliary pixel Pa2 corresponding to the second row and second column of the first pixel group Pg1, an auxiliary pixel Pa4 corresponding to the second row and third column of the first pixel group Pg1, and an auxiliary pixel Pa5 corresponding to the second row and fourth column of the first pixel group Pg1 may be arranged around one vertex of the transmission portion TA having a rectangular shape. Further, an auxiliary pixel Pa3 corresponding to the first row and fourth column of the second pixel group Pg2 may be arranged around one vertex thereof.

Generally, the initialization voltage line VIL, the first scan line SLK-1, the second scan line SLK, and the light emission control line ELK, extending in the first direction (X direction), may include a bending portion extending in the second direction (Y direction) intersecting (or crossing) the first direction (X direction) around one vertex of the transmission portion TA.

The data line DL_a and the second driving voltage line VDDL2_a may extend in the second direction (Y direction) on the auxiliary pixel Pa1 corresponding to the second row and first column of the first pixel group Pg1, the data line DL_b and the second driving voltage line VDDL2_b may extend in the second direction (Y direction) on the auxiliary pixel Pa2 corresponding to the second row and second column of the first pixel group Pg1, the data line DL_c and the second driving voltage line VDDL2_c may extend in the second direction (Y direction) on the auxiliary pixel Pa4 corresponding to the second row and third column of the first pixel group Pg1, and the data line DL_d and the second driving voltage line VDDL2_d may extend in the second direction (Y direction) on the auxiliary pixel Pa5 corresponding to the second row and fourth column of the first pixel group Pg1.

The initialization voltage line VIL, the first scan line SKJ-1, the second scan line SLK, and the light emission control line ELK may extend in the first direction (X direction) on the auxiliary pixel Pa3 corresponding to the first row and fourth column of the second pixel group Pg2.

According to an embodiment, the data lines DL_a, DL_b, DL_c, and DL_d may be formed of the first data metal layer DTL1 formed on the second interlayer insulating film 142 on both the auxiliary pixels Pa1, Pa2, Pa4, and Pa5 and the transmission portion TA. The second driving voltage lines VDDL2_a, VDDL2_b, VDDL2_c, and VDDL2_d may be formed of the first data metal layer DTL1 formed on the second interlayer insulating film 142 on the auxiliary pixels Pa1, Pa2, Pa4, and Pa5. The integrated wiring VDDL2_BE of the second driving voltage line may be formed of the second data metal layer DTL2 formed on the protective film 150 on the transmission portion TA. The integrated wiring VDDL2_BE of the second driving voltage line may be electrically and/or physically connected to the respective second driving voltage lines VDDL2_a, VDDL2_b, VDDL2_c, and VDDL2_d through the tenth contact holes CNT10_a, CNT10_b, CNT10_c, and CNT10_d formed in the protective film 150.

Generally, the data lines DL_a, DL_b, DL_c, and DL_d and the integrated line VDDL2_BE of the second driving voltage line, extending in the second direction (Y direction), may include a bending portion extending in the first direction (X direction) intersecting (or crossing) the second direction (Y direction) around one vertex of the transmission portion TA. The integrated wiring VDDL2_BE of the second driving voltage line may overlap the first scan line SLK-1 in the third direction (Z direction) in a region around one vertex of the transmission portion TA.

Figure 16:
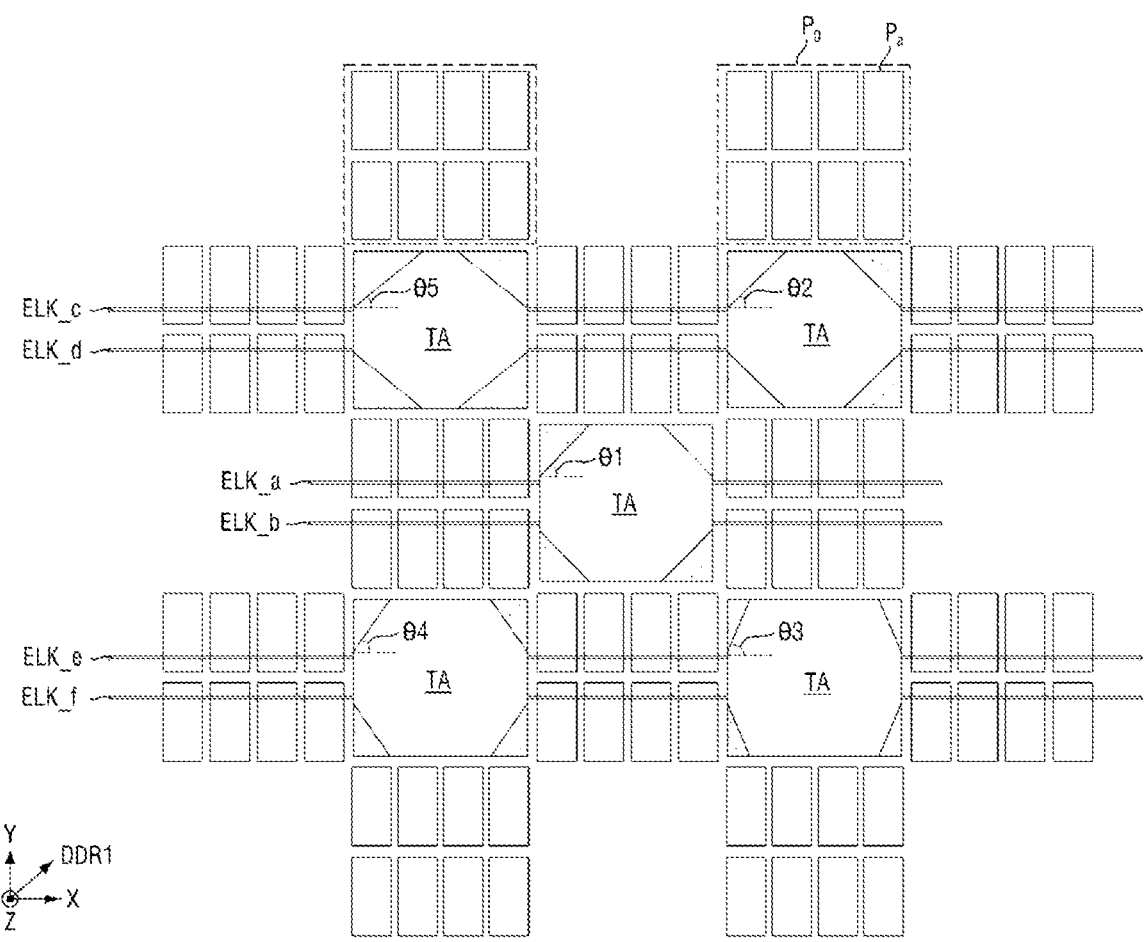
FIG. 16 is a view showing wirings disposed on a transmission portion according to another embodiment.

FIG. 16 is a view showing wirings disposed on a transmission portion according to another embodiment.

Referring to FIG. 16, the present embodiment is different from the embodiment shown in FIG. 11 in that the angles θ1, θ2, θ3, θ4, and θ5 of the hypotenuses of the extension portions of the light emission control lines respectively arranged in the plurality of transmission portions TA to the first direction (X direction) are different from each other.

More specifically, the plurality of transmission portions TA may be alternately disposed with the plurality of pixel groups Pg along the first direction X and/or the second direction Y. In one alternative embodiment, the transmission portions TA may be arranged to surround the pixel group Pg.

The plurality of light emission control lines ELK_a, ELK_b, ELK_c, ELK_d, ELK_e, and ELK_f may be generally arranged in the first direction (X direction), and may include a triangular extension portion ELK_Ex at the vertex of the transmission portion TA. The extension portion ELK_Ex may include a hypotenuse extending in the first diagonal direction DDR1 between the first direction (X direction) and the second direction (Y direction). The angles θ1, θ2, θ3, θ4, and θ5 of the hypotenuses to the first direction (X direction) may be different from each other. For example, the angles θ1, θ2, θ3, θ4, and θ5 of the hypotenuses to the first direction (X direction) may be acute angles of greater than 0° and smaller than 90°. As the angles θ1, θ2, θ3, θ4, and θ5 of the hypotenuses to the first direction (X direction) increase, the light transmission amount of the transmission portion TA may increase.

Because the triangular extension portion ELK_Ex is provided at the vertex of the rectangular transmission portion TA, the transmission portion TA may have a planar octagonal shape, and a sensor device (such as a sensor) may be disposed under the plurality of transmission portions TA. According to an embodiment, the length of one side of the transmission portion TA may be 80 μm, and the length of one side of the sensor device SS, such as a sensor, may be 4 mm. That is, a very large number of transmission portions TA may be matched to one sensor device SS. When the angles θ1, θ2, θ3, θ4, and θ5 of the hypotenuses of the extension portions ELK_Ex disposed in the respective transmission portions TA are different from each other, the light passing through the transmission portion TA is diffracted slightly differently, and the effect similar to that in the case where the light passing through the circular transmission portion TA is diffracted may be exhibited on average.

Figure 17:
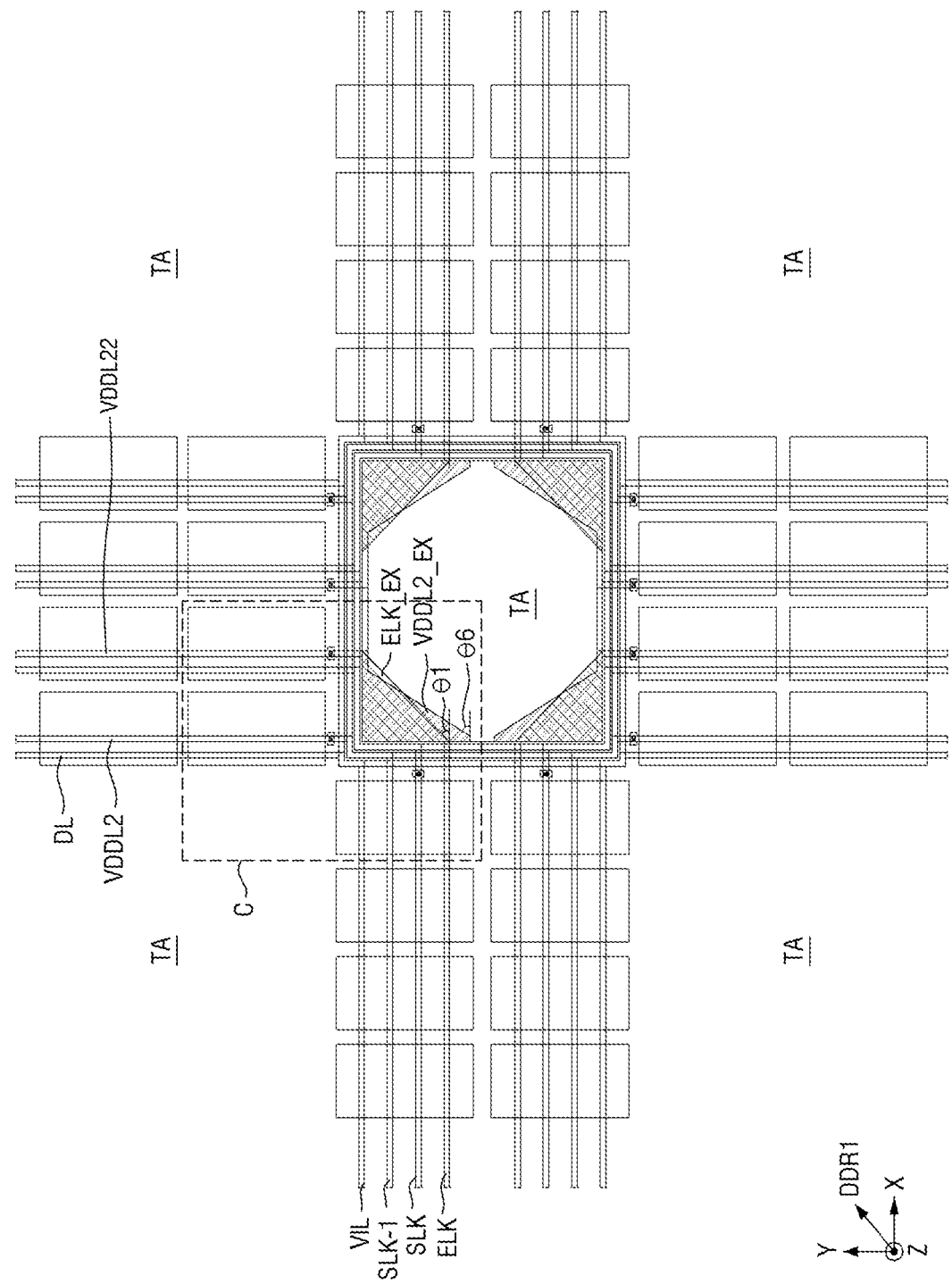
FIG. 17 is a view showing wirings disposed on a transmission portion according to another embodiment.
Figure 18:
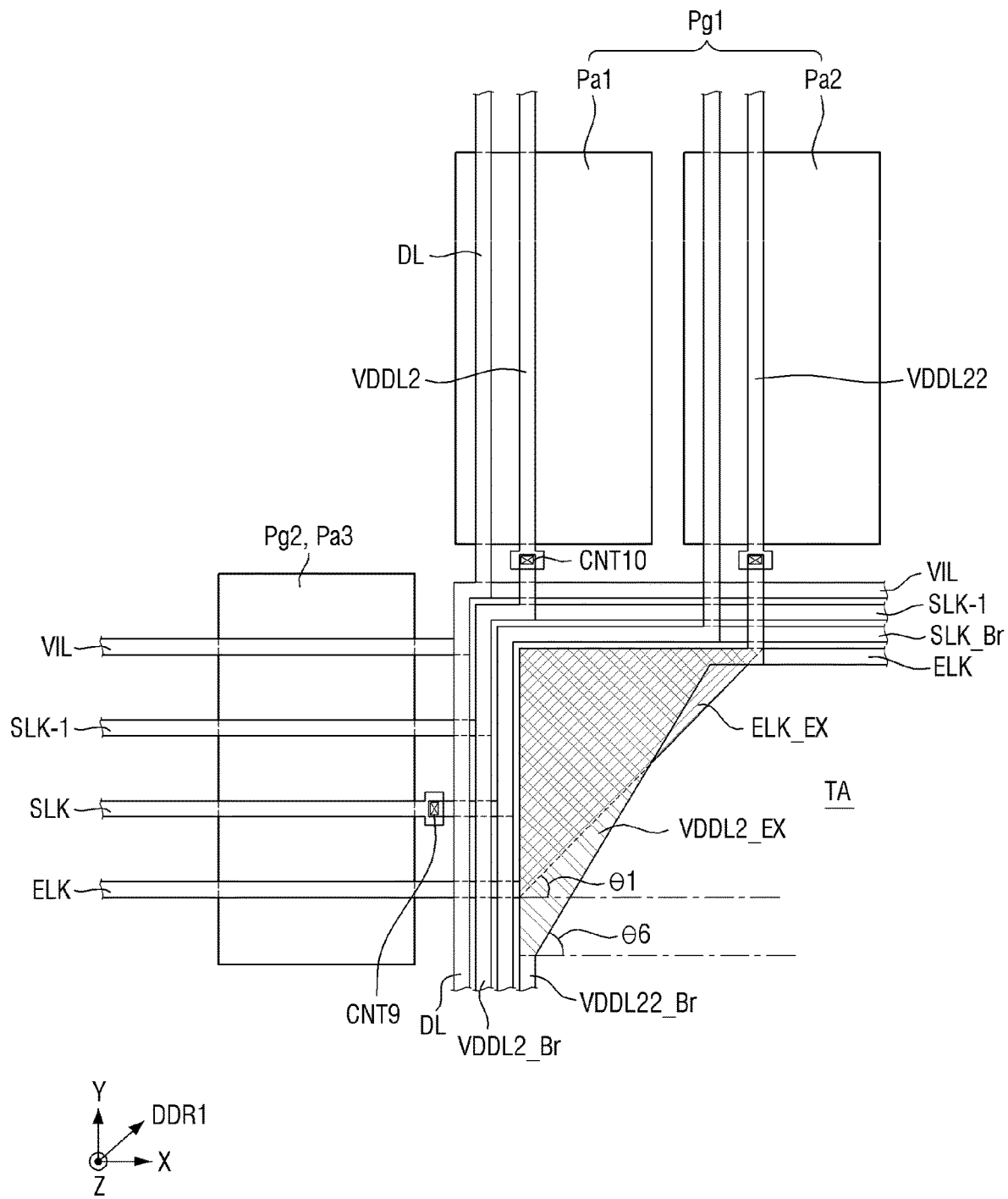
FIG. 18 is an enlarged view of the area C of FIG. 17.

FIG. 17 is a view showing wirings disposed on a transmission portion according to another embodiment, and FIG. 18 is an enlarged view of the area C of FIG. 17.

Referring to FIGS. 17 and 18, the present embodiment is different from the embodiment of FIG. 11 in that a triangular second extension portion VDDL2_Ex is further provided in a region near the bending portion of the connection line VDDL22_Br of the second driving voltage line.

More specifically, the light emission control line ELK may be formed of the first gate layer GTL1 on both the auxiliary pixel Pa3 and the transmission portion TA. Generally, the light emission control line ELK extending in one direction (X direction) may include a bending portion extending in the second direction (Y direction) intersecting (or crossing) the first direction (X direction) near one vertex of the transmission portion TA.

The light emission control line ELK may include a first extension portion ELK_Ex in a region near the bending portion. The first extension portion ELK_Ex may be concurrently or simultaneously formed of the same material as the light emission control line ELK. For example, the first extension portion ELK_Ex may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

The connection wiring VDDL22_Br of the second driving voltage line may be electrically and/or physically connected to the second driving voltage line VDDL22 through the tenth contact hole CNT10. The connection wiring VDDL22_Br of the second driving voltage line may be formed of the second data metal layer DTL2 formed on the protective film 150 on the transmission portion TA.

The connection wiring VDDL22_Br of the second driving voltage line may include a second extension portion VDDL2_Ex in a region near the bending portion. The second extension portion VDDL2_Ex may be concurrently or simultaneously formed of the same material as the connection wiring VDDL22_Br of the second driving voltage line. For example, the second extension portion VDDL2_Ex may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

The second extension part VDDL2_Ex may include a hypotenuse extending in the first diagonal direction DDR1 between the first direction (X direction) and the second direction (Y direction). The angle θ6 of the hypotenuse of the second extension portion VDDL2_Ex to the first direction (X direction) may be different from the angle θ1 of the hypotenuse of the first extension portion ELK_Ex to the first direction (X direction). According to an embodiment, the angle θ6 of the hypotenuse of the second extension portion VDDL2_Ex to the first direction (X direction) may be greater than the angle θ1 of the hypotenuse of the first extension portion ELK_Ex to the first direction (X direction). In this case, the first extension portion ELK_Ex and the second extension portion VDDL2_Ex may only partially overlap each other in the third direction DR3.

Because the first triangular extension portion ELK_Ex and the second triangular extension portion VDDL2_Ex are disposed at each of the four vertices of the rectangular transmission portion TA, as a result, the transmission portion TA may have a planar dodecagonal shape. In the dodecagonal transmission portion TA as compared with the rectangular transmission portion TA, the aforementioned diffraction phenomenon may be reduced. Thus, the first extension portion ELK_Ex and the second extension portion VDDL2_Ex are further formed in the process of forming the plurality of wirings without an additional separate process, thereby maintaining suitable (e.g., good) detection ability of the sensor device (such as the sensor) disposed under the transmission portion TA.

Figure 19:
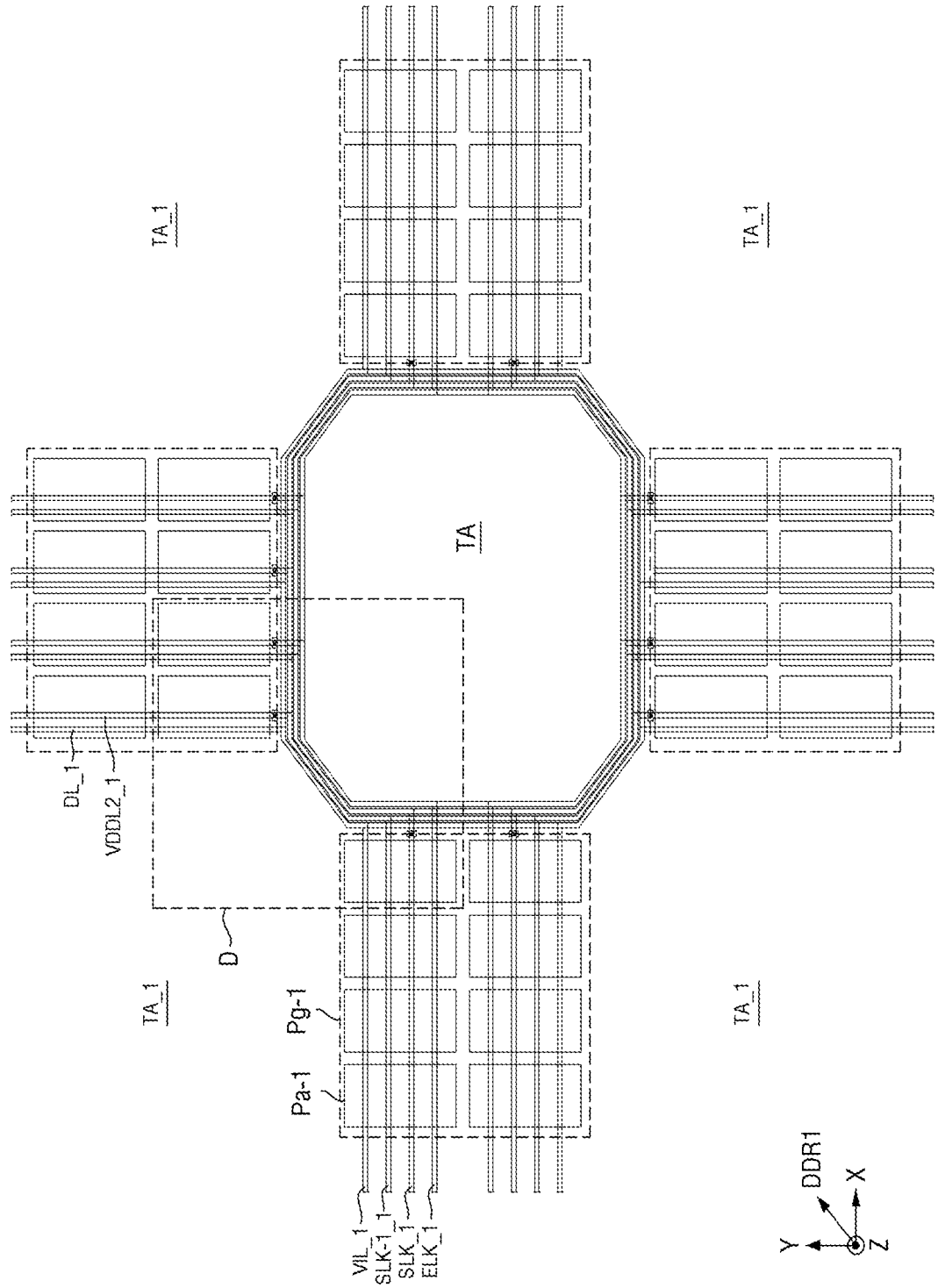
FIG. 19 is a view showing wirings disposed on a transmission portion according to another embodiment.
Figure 20:
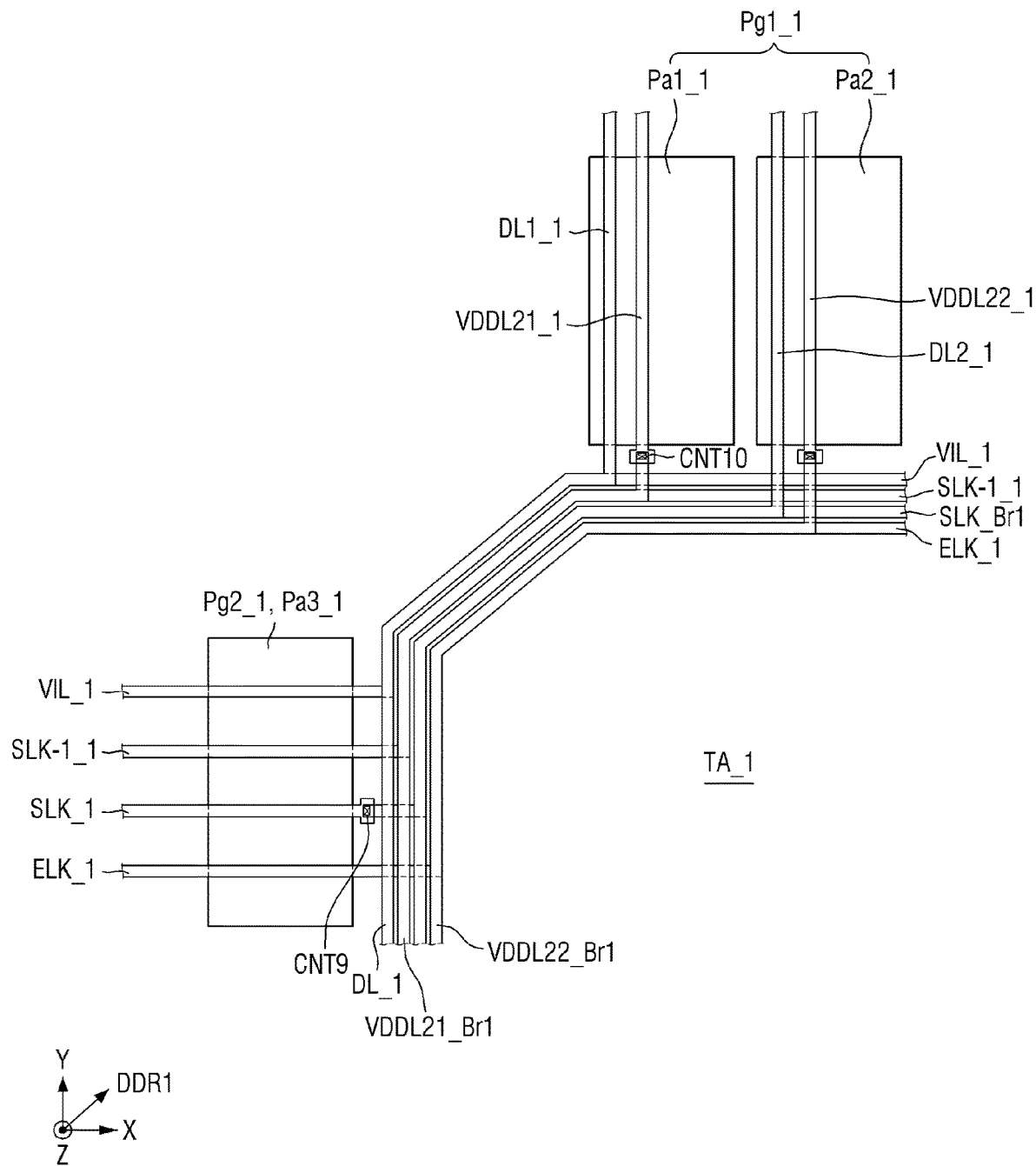
FIG. 20 is an enlarged view of the area D of FIG. 19.

FIG. 19 is a view showing wirings disposed on a transmission portion according to another embodiment, and FIG. 20 is an enlarged view of the area D of FIG. 19.

Referring to FIGS. 19 and 20, the present embodiment is different from the embodiment of FIG. 11 in that a pixel group Pg_1 shown in FIG. 19 has a smaller area than the pixel group Pg shown in FIG. 4 and in that a plurality of wirings VIL_1, SLK-1_1, SLK_1, ELK_1, DL1_1, and VDDL2_1 connecting the plurality of pixel groups Pg_1 include two bending portions in the vertex region of the transmission portion TA.

More specifically, when the pixel group Pg shown in FIG. 4 has a pixel size of FHD (Full High Definition) (about 400 ppi), the pixel group Pg_1 shown in FIGS. 19 and 20 may have a pixel size of UHD (Ultra High Definition) (about 500 ppi). Accordingly, the distance between the pixel groups Pg_1 may be increased. That is, the area of one transmission portion TA may be larger than the area of one auxiliary pixel Pg_1.

According to an embodiment, the transmission portion TA may have a rectangular shape before the plurality of wirings VIL_1, SLK-1_1, SLK_1, ELK_1, DL1_1, and VDDL2_1 are arranged, and the plurality of auxiliary pixels Pa_1 may be arranged in two rows and four columns. As shown in FIG. 20, an auxiliary pixel Pa1_1 corresponding to the second row and first column of the first pixel group Pg1_1, an auxiliary pixel Pa2_1 corresponding to the second row and second column of the first pixel group Pg1_1, and an auxiliary pixel Pa3_1 corresponding to the first row and fourth column of the second pixel group Pg2_1 may be arranged around one vertex of the transmission portion TA having a rectangular shape.

The data line DL1_1 and the second driving voltage line VDDL21_1 may extend in the second direction (Y direction) on the auxiliary pixel Pa1_1 corresponding to the second row and first column of the first pixel group Pg1_1, and the data line DL2_1 and the second driving voltage line VDDL22_1 may extend in the second direction (Y direction) on the auxiliary pixel Pa2_1 corresponding to the second row and second column of the first pixel group Pg1_1. The initialization voltage line VIL_1, the first scan line SLK-1_1, the second scan line SLK_1, and the light emission control line ELK_1 may extend in the first direction (X direction) on the auxiliary pixel Pa3_1 corresponding to the first row and fourth column of the second pixel group Pg2_1.

In order to ensure the maximum transmittance of the transmission portion TA, the plurality of wirings VIL_1, SLK-1_1, SLK_1, ELK_1, DL1_1, and VDDL2_1 may be arranged along the edge of the transmission portion TA. For convenience of explanation, although it is shown in the drawings that the initialization voltage line VIL_1, the first scan line SLK-1_1, the second scan line SLK_1, and the light emission control line ELK_1, extending in the first direction (X direction), are arranged to be spaced apart from each other by a set or predetermined interval, the plurality of wirings VIL_1, SLK-1_1, SLK_1, ELK_1, DL1_1, VDDL21_1, DL2_1, and VDDL22_1 may be arranged without being spaced apart from each other in a plan view.

According to an embodiment, the initialization voltage line VIL_1 may be formed of the second gate layer GTL2 formed on the gate insulating film 130 on both the auxiliary pixel Pa3_1 and the transmission portion TA. The first scan line SLK-1_1 may be formed of the first gate layer GTL1 formed on the buffer film BF on both the auxiliary pixel Pa3 and the transmission portion TA. The second scan line SLK_1 may be formed of the first gate layer GTL1 formed on the buffer film BF on the auxiliary pixel Pa3, and the second scan line connection line SLK_Br1 may be formed of a second gate layer GTL2 formed on the gate insulating film 130 on the transmission portion TA. The second scan line connection line SLK_Br1 may be electrically and/or physically connected to the second scan line SLK_1 through a ninth contact hole CNT9 formed in the gate insulating film 130. The light emission control line ELK_1 may be formed of the first gate layer GTL1 formed on the buffer film BF on both the auxiliary pixel Pa3_1 and the transmission portion TA.

Generally, the initialization voltage line VIL_1, the first scan line SLK-1_1, the second scan line SLK_1, and the light emission control line ELK_1, extending in the first direction (X direction), may include a section extending in the first diagonal direction DDR1 between the first direction (X direction) and the second direction (Y direction), and thus may include two bending portions.

According to an embodiment, the data lines DL1_1 and DL2_1 may be formed of the first data metal layer DTL1 formed on the second interlayer insulating film 142 on both the auxiliary pixels Pa1_1 and Pa2_1 and the transmission portion TA. The second driving voltage lines VDDL21_1 and VDDL22_1 may be formed of the first data metal layer DTL1 formed on the second interlayer insulating film 142 on the auxiliary pixels Pa1_1 and Pa2_1. The connection wirings VDDL21_Br1 and VDDL22_Br1 of the second driving voltage line may be formed of the second data metal layer DTL2 formed on the protective film 150 on the transmission portion TA. The connection wirings VDDL21_Br1 and VDDL22_Br1 of the second driving voltage line may be electrically and/or physically connected to each other through the tenth contact hole CNT10 formed in the protective film 150.

Generally, the data line DL1 and DL2 and the second driving voltage lines VDDL21 and VDDL22, extending in the second direction (Y direction), may include a section extending in the first diagonal direction DDR1 between the first direction (X direction) and the second direction (Y direction), and thus may include two bending portions.

The data line DL1_1 and the second driving voltage line VDDL21_1 disposed on the auxiliary pixel Pa1_1 may be disposed to overlap the initialization voltage line VIL_1 and the first scan line SLK-1_1 in the third direction (Z direction) at the two bending portions and around the two bending portions, respectively, and the data line DL2_1 and the second driving voltage line VDDL22_1 disposed on the auxiliary pixel Pa2_1 may be disposed to overlap the second scan line SLK_1 and the light emission control line ELK_1 in the third direction (Z direction) at the two bending portions and around the two bending portions, respectively.

According to the embodiments of the present disclosure, because the arrangement of the plurality of wirings VIL_1, SLK-1_1, SLK_1, ELK_1, DL1_1, VDDL21_1, DL2_1, and VDDL22_1 at another vertex of the transmission portion TA is symmetrical to the aforementioned contents in the first direction (X direction) and the second direction (Y direction), hereinafter, a detailed description thereof will be omitted. Because the wirings extending in the first direction include a section extending in the first diagonal direction DDR1 by the two bending portions at each of the four vertices of the rectangular transmission portion TA, as a result, the transmission portion TA may have a planar octagonal shape. In the octagonal transmission portion TA as compared with the rectangular transmission portion TA, the aforementioned diffraction phenomenon may be reduced. Thus, the section extending in the first diagonal direction DDR1 by the two bending portions in the process of forming the plurality of wirings without an additional separate process, thereby maintaining suitable (e.g., good) detection ability of the sensor device (such as the sensor) disposed under the transmission portion TA.

According to the embodiments of the present disclosure, there can be provided a display device, in which the diffraction of light is reduced around a transmission portion, thereby improving the light receiving quantity and light receiving quality of a sensor device disposed under the transmission portion.

The use of "may" when describing embodiments of the present invention refers to "one or more embodiments of the present invention." Also, the term "exemplary" is intended to refer to an example or illustration.

Although certain exemplary embodiments and implementations have been described herein, other embodiments and modifications will be apparent from this description. Accordingly, the subject matter of the present disclosure are not limited to such embodiments, but rather to the broader scope of the appended claims and various obvious modifications and equivalent arrangements as would be apparent to a person of ordinary skill in the art.

What is claimed is:

1. A display device, comprising:
    a substrate comprising a display area comprising a plurality of main pixels, and a sensor area comprising a plurality of auxiliary pixels and a plurality of transmission portions; and
    a plurality of wirings arranged along edges of the plurality of transmission portions and electrically connecting the plurality of auxiliary pixels,
    wherein:
    the plurality of wrings comprises a plurality of first directional wirings extending in a first direction and arranged with each other in a second direction crossing the first direction, and a plurality of second directional wirings extending in the second direction and arranged with each other in the first direction, and
    a wiring adjacent to the transmission portion from among the plurality of first directional wirings comprises a first extension portion,
    wherein the plurality of first directional wirings comprise a first wiring to apply an initialization voltage into auxiliary pixels arranged in the first direction from among the plurality of auxiliary pixels and a second wiring to apply a first scan signal into the auxiliary pixels arranged in the first direction, and
    wherein in an area in which the auxiliary pixels arranged in the first direction are arranged, the second wiring is on the substrate, a first insulation layer is on the second wiring and the first wiring is on the first insulation layer.

2. The display device of claim 1,
    wherein each transmission portion of the plurality of transmission portions has a polygonal shape, a circular shape, or an elliptical shape in a plan view.

3. The display device of claim 1,
    wherein each transmission portion of the plurality of transmission portions has an octagonal shape in a plan view.

4. The display device of claim 1, further comprising a sensor device overlapping with the plurality of transmission portions in a thickness direction of the substrate, the sensor device is to sense infrared light, visible light, and/or sound.

5. The display device of claim 1,
    wherein the plurality of first directional wirings further comprise:
    a third wiring to apply a second scan signal into the auxiliary pixels arranged in the first direction; and
    a fourth wiring to apply an emission control signal into the auxiliary pixels arranged in the first direction.

6. The display device of claim 5,
    wherein the plurality of second directional wirings comprise:
    a fifth wiring to apply a data voltage into auxiliary pixels arranged in the second direction from among the plurality of auxiliary pixels; and
    a sixth wiring to apply a first power into the auxiliary pixels arranged in the second direction.

7. The display device of claim 6,
    wherein each of the first to sixth wirings comprises a bending portion that is bent at the edges of the plurality of transmission portions in a plan view, and
    the first extension portion is extended from the bending portion of the fourth wiring.

8. The display device of claim 7,
wherein the first extension portion has a triangle shape in the plan view.
9. The display device of claim 7,
wherein the first extension portion comprises a first hypotenuse facing the bending portion, and an angle of the first hypotenuse to the first direction is different for each transmission portion.
10. The display device of claim 9,
wherein the sixth wiring comprises a second extension portion extending from the bending portion of the sixth wiring toward the transmission portion.
11. The display device of claim 10,
wherein the second extension portion has a triangle shape in the plan view.
12. The display device of claim 11,
wherein the second extension portion comprises a second hypotenuse facing the bending portion, and an angle of the second hypotenuse to the first direction is different from the angle of the first hypotenuse to the first direction.
13. The display device of claim 10,
wherein the first extension portion comprises a same material as the fourth wiring, and the second extension portion comprises a same material as the sixth wiring.
14. A display device, comprising:
a substrate comprising a display area comprising a plurality of main pixels, and a sensor area comprising a plurality of auxiliary pixels and a plurality of transmission portions; and
a plurality of wirings arranged along edges of the plurality of transmission portions and electrically connecting the plurality of auxiliary pixels,
wherein:
the plurality of wrings comprises a plurality of first directional wirings extending in a first direction and arranged with each other in a second direction crossing the first direction, and a plurality of second directional wirings extending in the second direction and arranged with each other in the first direction, and
a wiring adjacent to the transmission portion from among the plurality of first directional wirings comprises a first extension portion,
wherein the plurality of first directional wirings comprise:
a first wiring to apply an initialization voltage into auxiliary pixels arranged in the first direction from among the plurality of auxiliary pixels;
a second wiring to apply a first scan signal into the auxiliary pixels arranged in the first direction;
a third wiring to apply a second scan signal into the auxiliary pixels arranged in the first direction; and
a fourth wiring to apply an emission control signal into the auxiliary pixels arranged in the first direction,
wherein the plurality of second directional wirings comprise:
a fifth wiring to apply a data voltage into auxiliary pixels arranged in the second direction from among the plurality of auxiliary pixels; and
a sixth wiring to apply a first power into the auxiliary pixels arranged in the second direction, and
wherein in an area in which the auxiliary pixels arranged in the first direction are arranged, the second wiring, the third wiring, and the fourth wiring are on the substrate, a first insulation layer is on the second wiring, the third wiring, and the fourth wiring, and the first wiring is on the first insulation layer.

15. The display device of claim 14,
wherein in the edges of the plurality of transmission portions, the second wiring and the fourth wiring are on the substrate, and the first wiring and a connection wiring of the third wiring are on the first insulation layer.
16. The display device of claim 15,
wherein the connection wiring of the third wiring is connected to the third wiring through a first contact hole which penetrates the first insulating layer.
17. The display device of claim 14,
wherein in the area in which the auxiliary pixels arranged in the first direction are arranged, a second insulation layer is on the first wiring, and the fifth wiring and the sixth wiring are on the second insulation layer.
18. The display device of claim 17,
wherein in the edges of the plurality of transmission portions, the fifth wiring is on the second insulation layer, a third insulation layer is on the fifth wiring, and a connection wiring of the sixth wiring is on the third insulation layer.
19. The display device of claim 18,
wherein the connection wiring of the sixth wiring is connected to the sixth wiring through a second contact hole which penetrates the third insulating layer.
20. A display device, comprising:
a substrate comprising a display area comprising a plurality of main pixels, and a sensor area comprising a plurality of auxiliary pixels and a plurality of transmission portions; and
a plurality of wirings arranged along edges of the plurality of transmission portions and electrically connecting the plurality of auxiliary pixels to each other,
wherein the plurality of wrings comprises a plurality of first directional wirings extending in a first direction and arranged with each other in a second direction crossing the first direction, and a plurality of second directional wirings extending in the second direction and arranged with each other in the first direction, and
each of the plurality of first directional wirings comprises at least two bending portions extending in the second direction and arranged in the first direction, at the edges of the plurality of transmission portions,
wherein the plurality of first directional wirings comprise a first wiring to apply an initialization voltage into auxiliary pixels arranged in the first direction from among the plurality of auxiliary pixels and a second wiring to apply a first scan signal into the auxiliary pixels arranged in the first direction, and
wherein in an area in which the auxiliary pixels arranged in the first direction are arranged, the second wiring is on the substrate, a first insulation layer is on the second wiring and the first wiring is on the first insulation layer.
21. The display device of claim 20,
wherein an area of one of the plurality of transmission portions is larger than a light emitting area of one of the plurality of auxiliary pixels.
22. The display device of claim 20,
wherein the plurality of first directional wirings and the plurality of second directional wirings overlap each other in a thickness direction of the substrate in the at least two bending portions.

* * * * *